United States Patent [19]

Hansen et al.

[11] Patent Number: 5,410,670

[45] Date of Patent: Apr. 25, 1995

[54] ACCESSING SYSTEM THAT REDUCES ACCESS TIMES DUE TO TRANSMISSION DELAYS AND I/O ACCESS CIRCUITRY IN A BURST MODE RANDOM ACCESS MEMORY

[75] Inventors: Craig C. Hansen; John G. Campbell, both of Los Altos; Timothy B. Robinson, Boulder Creek, all of Calif.

[73] Assignee: MicroUnity Systems Engineering, Inc., Sunnyvale, Calif.

[21] Appl. No.: 71,237

[22] Filed: Jun. 2, 1993

[51] Int. Cl.⁶ .............................................. G06F 12/06
[52] U.S. Cl. ................... 395/425; 365/189.01; 365/230.01; 364/961.3; 364/964.26; 364/964.33
[58] Field of Search ............... 395/400, 425, 375, 425; 365/189.01, 230.01

[56] References Cited

U.S. PATENT DOCUMENTS

| | | | |
|---|---|---|---|
| 3,701,125 | 10/1972 | Chang et al. .......................... 365/4 |
| 4,193,121 | 3/1980 | Fedida et al. ......................... 395/250 |
| 4,954,946 | 9/1990 | Natusch et al. ....................... 395/325 |
| 4,954,987 | 9/1990 | Auvinen et al. ..................... 395/189.02 |
| 5,146,582 | 9/1992 | Begun ................................. 395/500 |
| 5,247,644 | 9/1993 | Johnson et al. ...................... 395/425 |
| 5,261,064 | 11/1993 | Wyland ................................ 395/400 |
| 5,280,594 | 1/1994 | Young et al. ......................... 395/425 |
| 5,289,584 | 2/1994 | Thome et al. ........................ 395/325 |

Primary Examiner—Parshotam S. Lall
Assistant Examiner—Brian Ledell
Attorney, Agent, or Firm—Burns, Doane, Swecker & Mathis

[57] ABSTRACT

A large burst mode memory accessing system includes N discrete sub-memories and three main I/O ports. Data is stored in the sub-memories so that the sub-memories are accessed depending on their proximity to the main I/O ports. Three parallel pipelines provide a data path to/from the main I/O ports and the sub-memories. The first pipeline functions to couple address/control signals to the memories such that adjacent sub-memories are accessed in half cycle intervals. The second pipeline functions to propagate accessed data from the sub-memories to the main I/O ports such that data is outputted from the main output port every successive clock cycle. The third pipeline propagates write data to the memories such that data presented at the input of the third pipeline on successive clock cycles is written into successive sub-memories. Redundancy circuits preserve data integrity without memory access interruption.

23 Claims, 9 Drawing Sheets

FIG_1

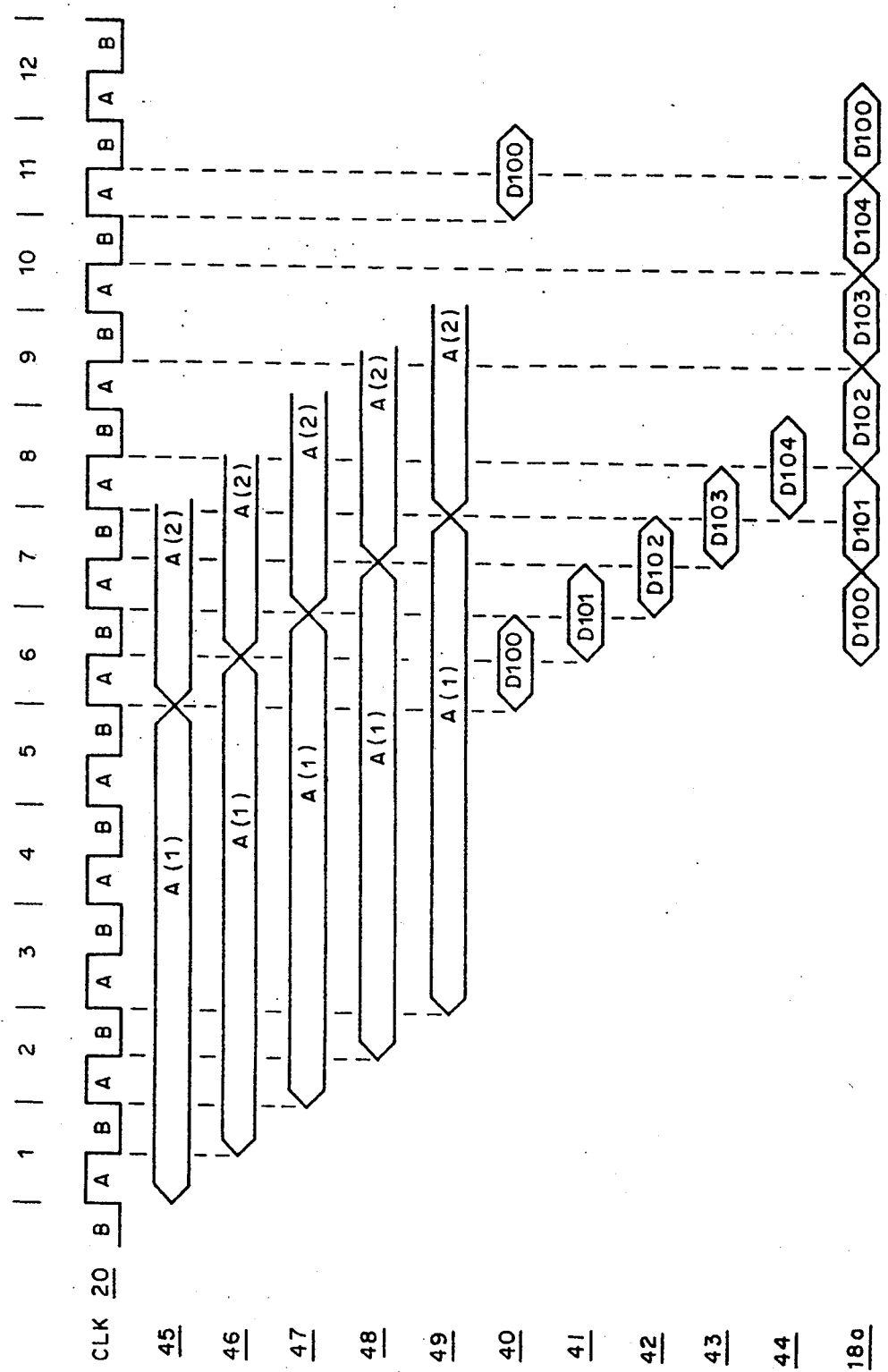

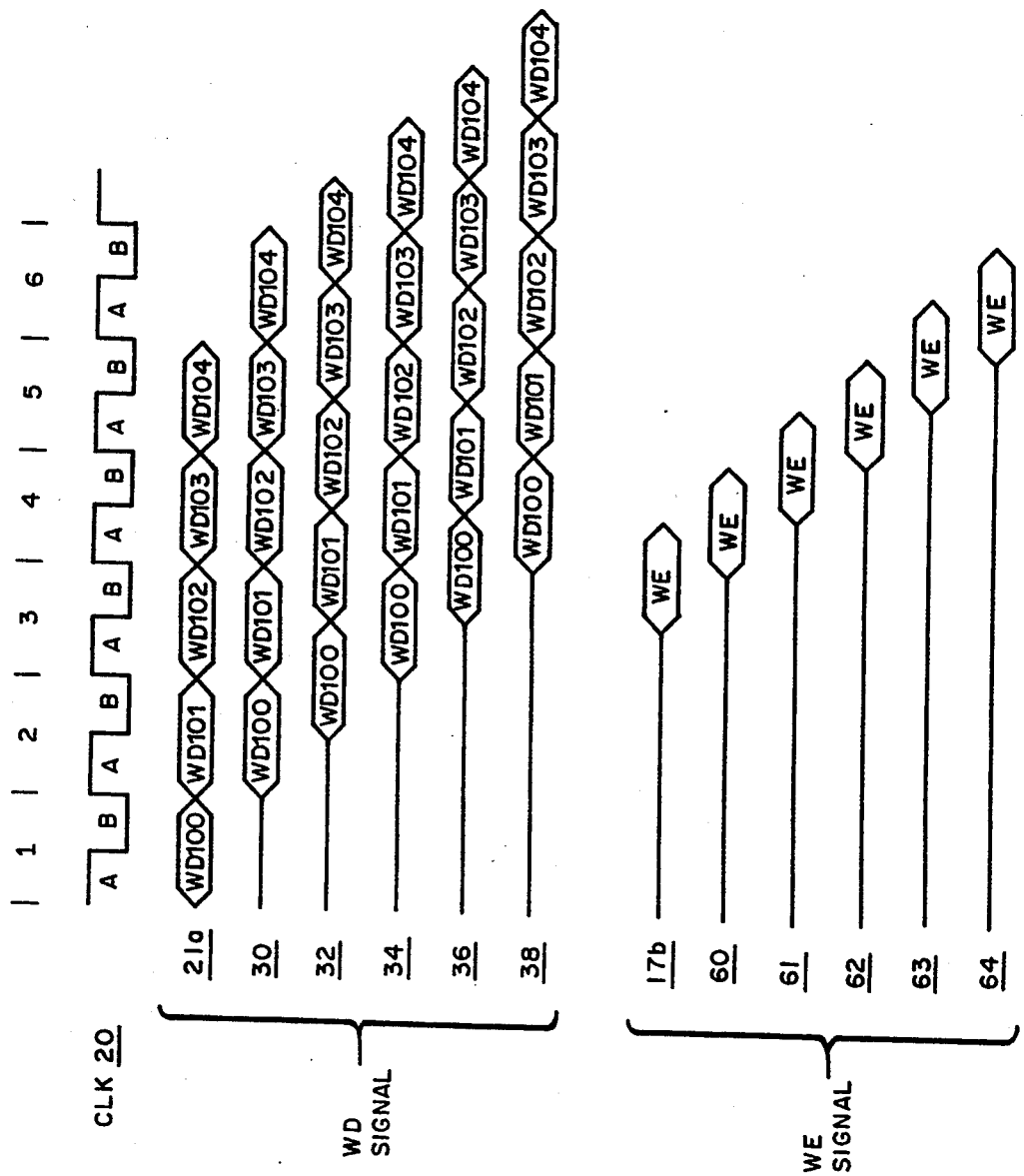

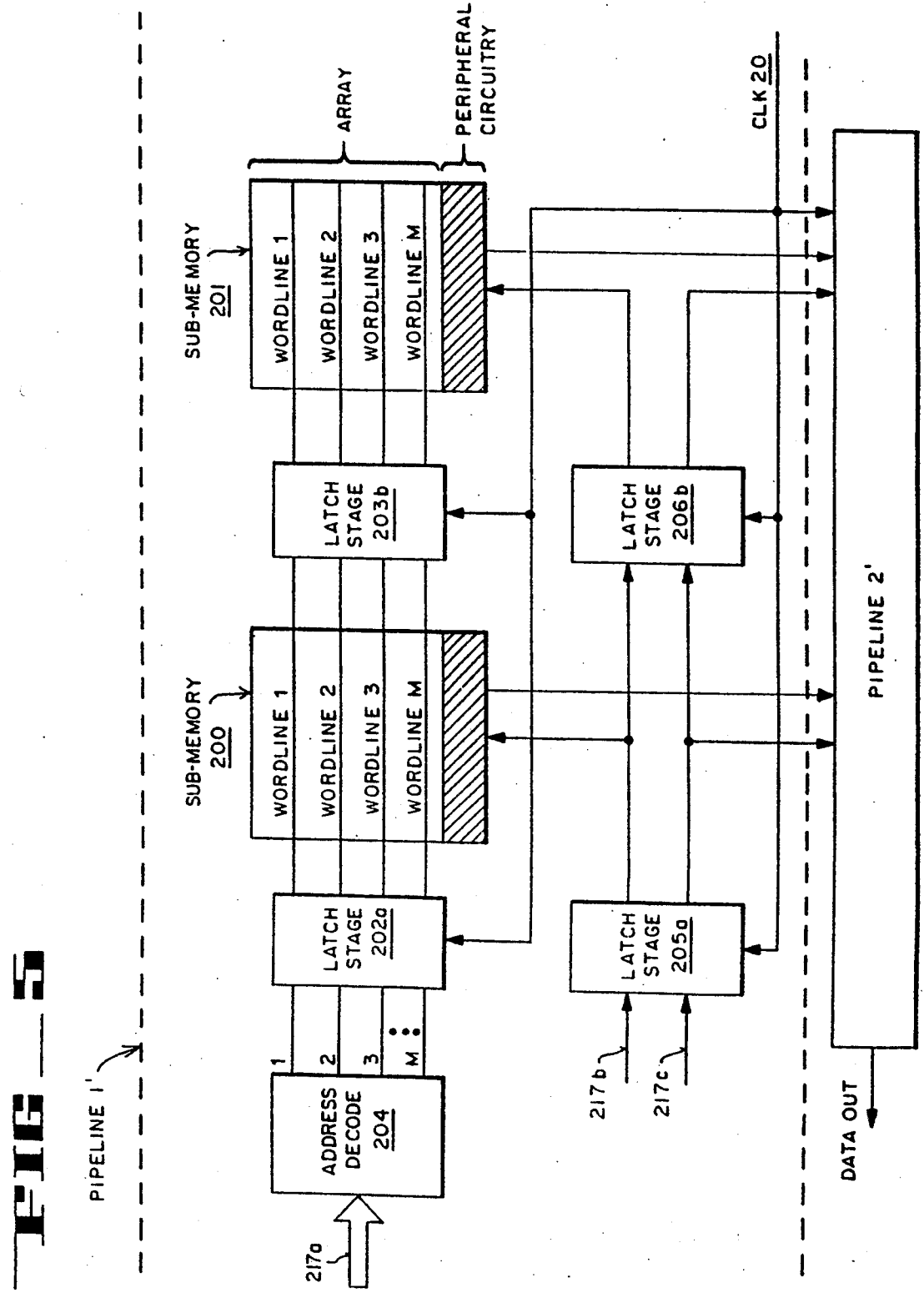
FIG.—5

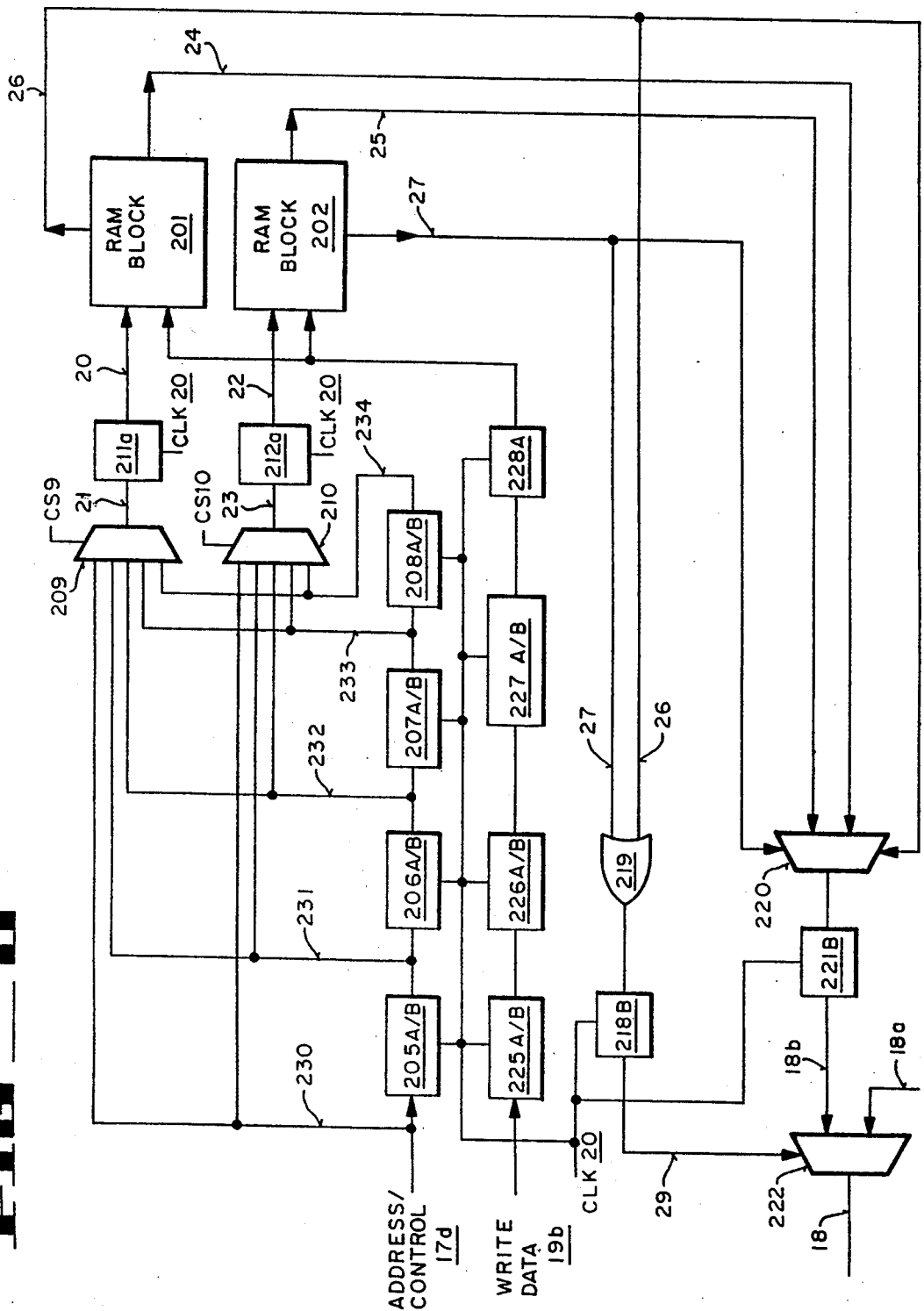
FIG_6

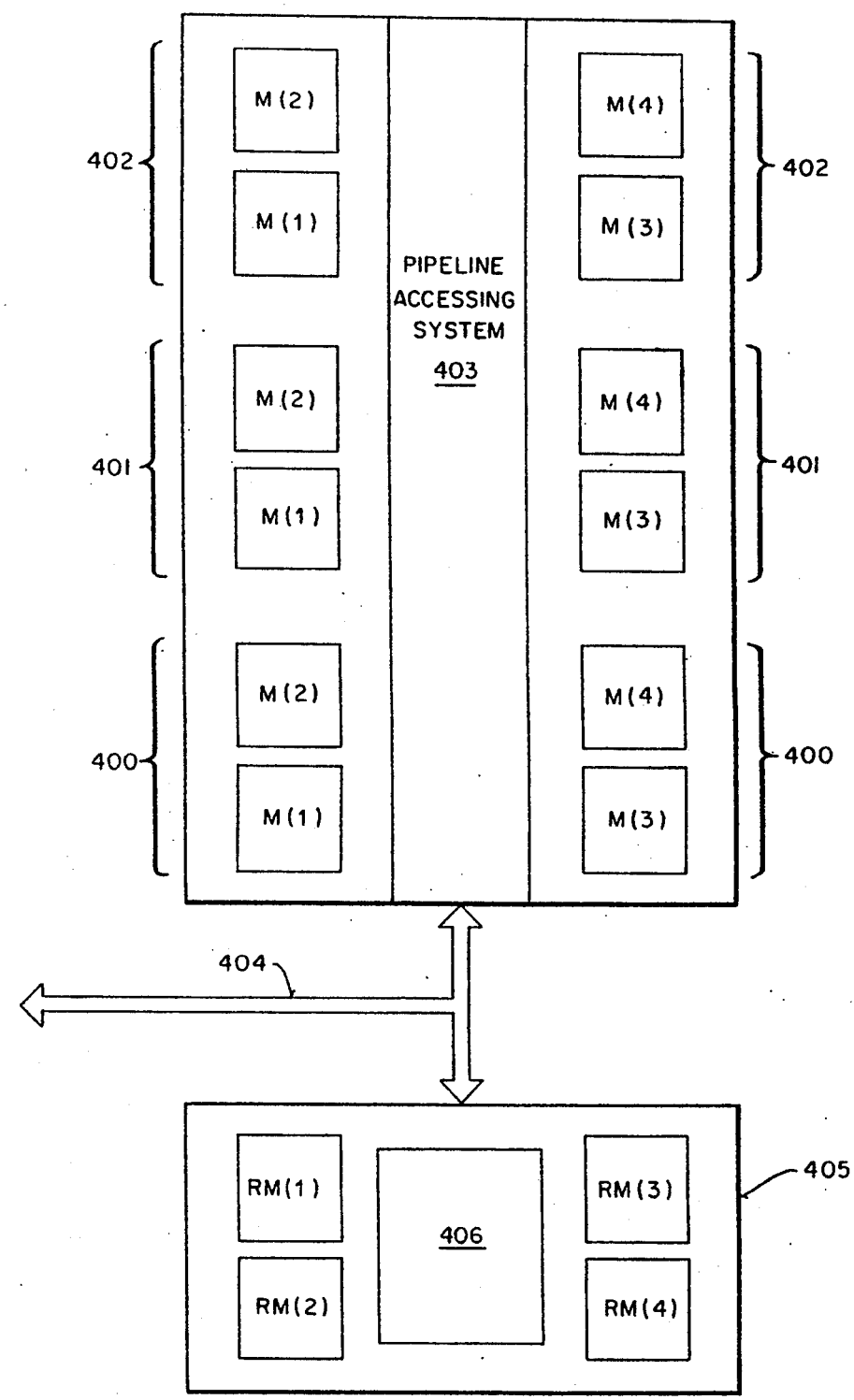
FIG_7

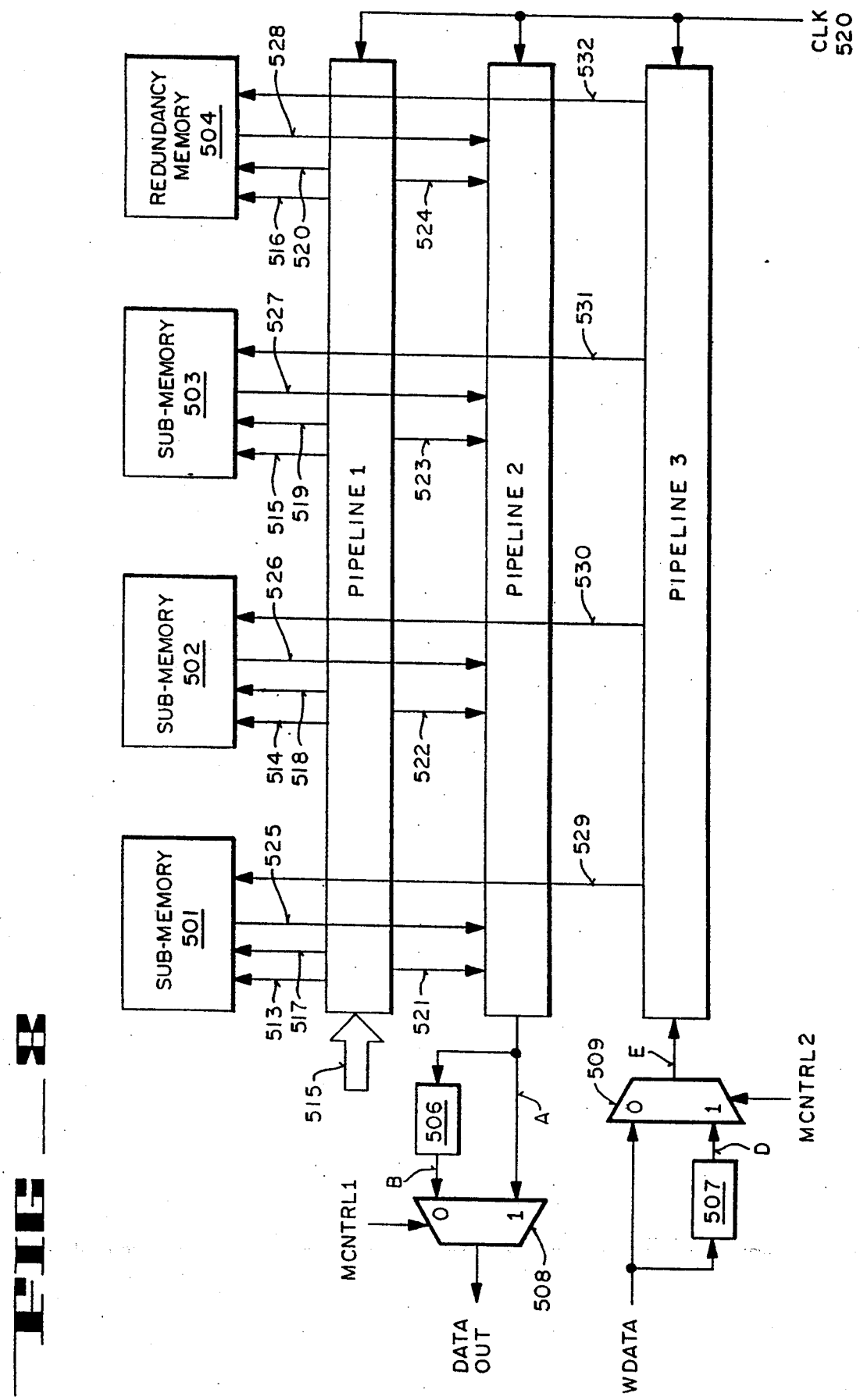

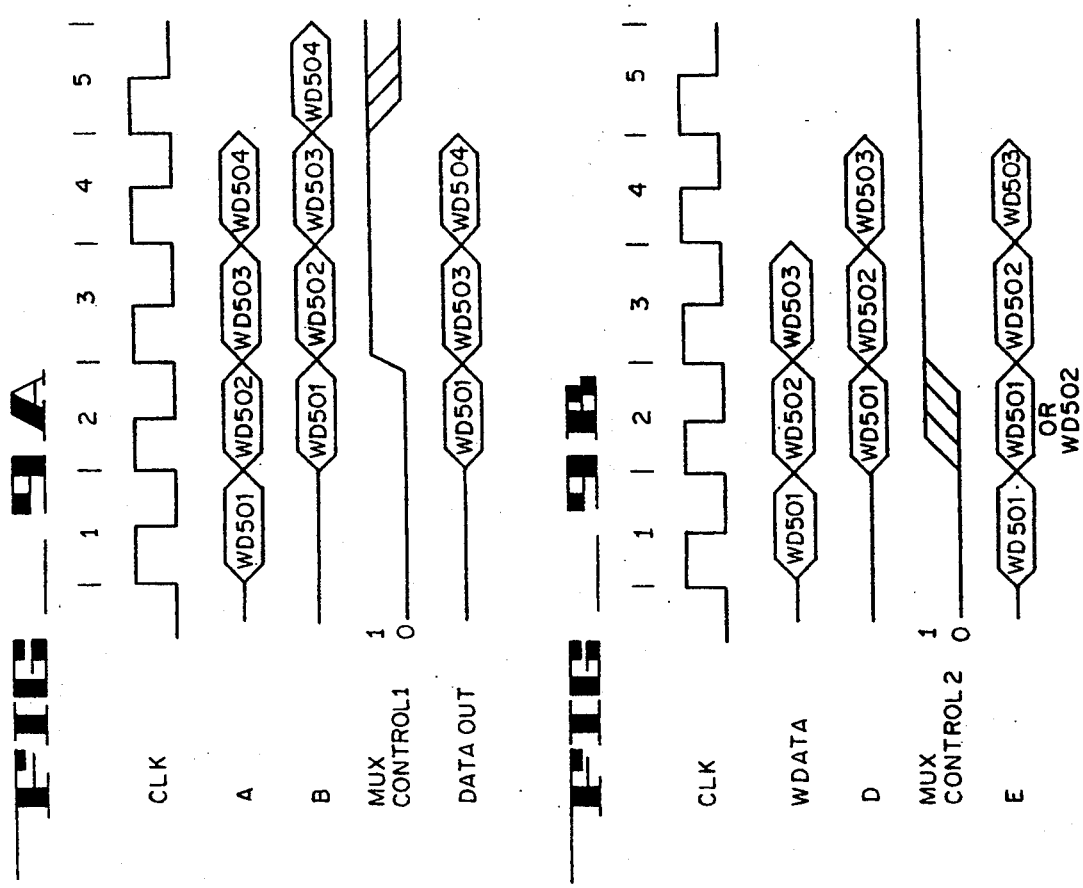

ACCESSING SYSTEM THAT REDUCES ACCESS TIMES DUE TO TRANSMISSION DELAYS AND I/O ACCESS CIRCUITRY IN A BURST MODE RANDOM ACCESS MEMORY

FIELD OF THE INVENTION

The present invention relates to the field of memory systems, and particularly to large burst mode memory systems.

BACKGROUND OF THE INVENTION

The memory or memory system is an essential element in most computer systems. One of the most crucial characteristics of a memory system is its speed, specifically read and write access times. Access times of a memory system are important because they determine the amount of data that can be made available to a processing unit, e.g. a CPU, in a computer system in a given time interval. If a memory system has relatively slow access times, less data is made available to a CPU as compared to a memory system having faster access times. As a result, the CPU may be inactive while waiting for data from a memory system having slow access times. Thus, the access times of a memory system can be a main determinant in the overall speed of a computer system.

The read access time of a memory system is measured from the time the address is applied to the input of the memory system to the time the accessed data is available at the output of the memory system. The write access time of a memory system is measured from the time data is applied to an input of the memory system to the time valid data is stored in the memory within the system.

There are many ways to minimize delays associated with write access times. For instance, if a CPU needs to write data into a memory system, but the memory system is unavailable, the data may be written into an intermediate memory, (such as a cache), and then written into the memory system at a later time. In this way, the CPU is freed up to continue processing after it has written the data into the intermediate memory.

However, reducing delays associated with read access times is much more difficult since the CPU must usually wait until it receives the requested data. As a result, read access times have become the most critical parameter for many memory systems.

Larger memories tend to have greater access times as compared to smaller memories due to wire capacitance and physical distances that signals must travel within the memories. Therefore, when a large amount of memory space is needed in a computer system, access times tend to be relatively slow due to the necessity of utilizing a large memory.

In an attempt to reduce access times for larger memories, it is common to utilize a memory system made up of many smaller sub-memory blocks. Each sub-memory block within the memory system has the same typical elements found in a single discrete memory, (i.e. decoding circuitry, input/output pods, enable line, word drivers etc.). By utilizing many sub-memory blocks (having fast access times) to form one large memory system, the overall access time of the larger memory system is reduced. So, a sub-memory block type of memory system typically has faster access times when compared to a single discrete large memory having the same amount of memory capacity.

A large memory system, made up of many smaller discrete memory blocks, is configured such that it has one main input access port. Addresses and control signals may be coupled to the main input port from a separate control system, i.e. a CPU. The memory system also has a main output data port for outputting the accessed data from the sub-memory blocks.

In addition to the main input and output (I/O) ports, the memory system also has input and output (I/O) access circuitry which function to get information to and from selected sub-memory blocks. The I/O access circuitry includes a multiplicity of logic gates. To access a selected sub-memory block within the memory system, the input access circuit gates an address signal from the main input address port, through each of the several logic gates, to the selected sub-memory block. Consequently, for an address to reach any sub-memory block in a memory system, it must pass through the same number of logic gates. Since the signal must pass through the same number of logic gates, there is a fixed delay time associated with the time an address propagates from the main input address port to any one of the sub-memory blocks. Similarly, the data outputted by the selected sub-memory block must propagate through an output access circuit which comprises another group of logic gates. The output access circuit gates the data from the selected sub-memory block, through each one of the output logic gates, to the main output port of the memory system. As with the input access circuitry, there is a fixed delay time associated with the time the accessed data must propagate from any one of the sub-memory blocks to the main output port of the memory system. Thus, the total delay and the delay associated with both the input and output access circuitry is fixed.

Another factor affecting the total accessing time of a sub-memory block type of memory system is related to the physical length of signal buses. Presently, semiconductor integrated circuits are designed such that the length of a line carrying a signal is a determinant in the amount of time it takes the signal to propagate from one point to another within the semiconductor integrated circuit; (this delay is typically referred to as transmission delay). Thus, in a very large scale integrated (VLSI) circuit it may take a signal longer to travel to one point than to another within that circuit depending on the distance the signal must travel.

VLSI circuits which include a sub-memory block type of memory system are particularly sensitive to transmission delays. The reason for this is because the sub-memory blocks are generally arranged in one large rectangular block area in the physical layout of the VLSI circuit. As a result, some of the sub-memory blocks are situated closer to the main I/O pods of the memory system than others. This means that input and output signals must travel farther to and from some of the sub-memory blocks than others. Therefore, due to the difference in proximity of each of the sub-memory blocks to the main I/O ports, the transmission delay for each of the sub-memory blocks is not the same.

In a computer system, varying access times due to inconsistent transmission delays are undesirable. Preferably, memory systems have fixed access times to allow for computer system synchronization. Two methods are commonly utilized to eliminate access time variations due to the physical layout of the memory system.

The first method physically arranges the main input and output ports of the memory system at opposite ends of the rectangular block of sub-memory blocks in the memory system circuit layout. For example, a sub-memory block that is located relatively close to the main input port of the memory system will be relatively far from the main output port. As a result, the time for the address signal to travel from the main input port to that sub-memory block will be relatively short. However, the time it takes for the accessed data to travel from that sub-memory block to the main output port will be relatively long. In contrast, a block that is located far from the main input port but close to the main output port will have a long input transmission delay and a short output transmission delay. Ergo, the overall transmission delay for each of the sub-memory blocks will be similar for each of the blocks, thus eliminating the inconsistent transmission delay times.

In contrast to the first method, the second method keeps the main I/O ports relatively close together on the same side of the memory system block in the circuit layout. In this arrangement, sub-memory blocks located close to the main I/O ports have a shorter delay associated with propagating a signal to and from the main I/O ports compared to farther sub-memory blocks, in other words, access times are different for each of the sub-memory blocks. As mentioned above, memory systems preferably have fixed access times. In order to obtain fixed access times from a system having its main I/O ports relatively close together, the memory system needs to be operated at a rate determined by the access delay to the farthest sub-memory block. In other words, even though data may be available from closer sub-memory blocks sooner than from farther blocks, the CPU assumes the data is not available or valid until after the delay of the farthest sub-memory block. Thus, the potential advantages that may be gained from closer sub-memory blocks having fast access times is wasted.

For sub-memory block memory systems as described above the two main factors affecting the total access time of a memory system are I/O access circuitry delay and I/O transmission delay. Of course in all memory systems the goal is to reduce the access delay times presented by these factors as much as possible.

When it is necessary to sequentially access some number of elements of the data stored in a memory system, (e.g. a cache line of data containing many words of data), the memory system is repeatedly accessed. Consequently, the total access delay time for all of the data to be read (or written into) is equal to the access delay time for a single read operation multiplied by the number of accesses necessary to read (or write) all of the data in the cache line.

One type of memory system that is utilized in a manner in which several elements of data are sequentially accessed is referred to as a burst mode memory system. As can be imagined, repeated memory system accessing of a burst mode memory system can result in a significant amount of access delay time. Obviously, it is desirable to reduce the access times for each read or write operation thus reducing the time it takes to read/write all of the memory locations in a burst mode type of memory system.

The large burst mode memory accessing system of the present invention reduces access times due to transmission delays and I/O access circuitry. Transmission delays are reduced by pre-arranging data in the sub-memory blocks in the memory system such that the memory blocks are accessed depending on their proximity to the main I/O ports. For example, the closest sub-memory block is accessed first, the next closest is accessed second, and so on. In addition, access times due to I/O access circuitry are reduced by providing a unique pipeline accessing system which eliminates the gate delays and transmission delays related to the prior art accessing systems. The total access delay of the memory system utilizing the accessing system of the present invention is approximately the same as that of a single sub-memory block.

The present invention also includes redundancy circuits compatible with the accessing system of the present invention for replacing defective sub-memory blocks.

SUMMARY OF THE INVENTION

A large burst mode memory accessing system is described.

The memory system is comprised of N sub-memory blocks, (N>1:N being an integer). The sub-memory blocks are physically arranged in a column. The main input and output port (main I/O ports) of the memory system are physically located at one end of the column, farthest from the Nth sub-memory. The data stored in the sub-memory blocks is pre-arranged such that the data in the sub-memory block closest to the main I/O ports is always first to be accessed for a particular location within the sub-memory block; the data from the next closest sub-memory block is second to be accessed for the same location within the sub-memory block and so on. The last sub-memory block to be accessed for this particular location is the Nth sub-memory; i.e. the farthest from the main I/O ports. In this way, as the closest sub-memory block is internally accessing and outputting its data, the adjacent farther ones are being accessed. By overlapping accesses, there is more time to get addressing information to the farther blocks and for data to travel to the main I/O ports.

The main input port of the memory system is coupled to the input of an address/control pipeline bus of the accessing system of the present invention. The address/control pipeline bus is physically located parallel to the column of N of sub-memory blocks in the memory system's layout. It is coupled to each of the sub-memory blocks. The bus functions to gate address and control signals along the pipeline such that signals get to each sub-memory block a half clock cycle later than the previous closer sub-memory block. In one embodiment, a first set of latches, (one for each sub-memory block), provide the half cycle gating function. Once each sub-memory block receives the address signal it begins to internally access its data at the specified address.

The output data from each sub-memory block is coupled to an output pipeline bus. The output pipeline is physically located parallel to the column of N sub-memory blocks in the memory system's physical layout and coupled to the main output port of the memory system. Since each of the sub-memory blocks are accessed in successive half cycle intervals (dependent on their physical location) by the address/control pipeline, and since each of the memory blocks have the same internal access time, data is available from each of the blocks in successive half clock cycle intervals. Therefore, data is coupled from the sub-memory blocks to the output pipeline in successive half clock cycle intervals.

The output pipeline has a second set of latches, (one for each sub-memory block), for gating the accessed data along the pipeline. Additionally, the output pipeline has a set of multiplexing gates, (also one for each sub-memory block), to direct the output data from each sub-memory block into the output pipeline. A control signal, which propagates along the address/control pipeline, controls the output pipeline's multiplexing gates as the accessed data from the sub-memory blocks propagate toward the main output port of the output pipeline. The accessing system of the present invention functions such that the data from the sub-memory blocks is sequentially outputted on subsequent clock cycles.

A write pipeline is utilized to perform the write operation. Similar to the address/control and output pipelines, the write pipeline is physically located parallel to the N sub-memory blocks in the memory systems physical layout. The write pipeline is coupled to each of the sub-memory blocks. A write operation is performed by first coupling a data signal to the input of the write pipeline and propagating it along the write pipeline to the farthest sub-memory block. This is performed by a third set of latches. The data signal is then gated by a fourth set of latches from the farthest sub-memory block back towards the closest sub-memory block. At the same time, a sub-memory block enable signal and an address signal are propagating along the address/control pipeline in the opposite direction as the data signal; i.e. from the closest to the farthest sub-memory block. The gating created by the third and fourth sets of latches in the write pipeline and the synchronization of the address and control signals from the address/control pipeline ensures that the data signal arrives at the appropriate sub-memory block at the same time as the sub-memory block enable signal and corresponding address signal. When this occurs, data is written into the sub-memory block. After this, the address and write enable signals are clocked down the address/control pipeline such that they arrive at the next sub-memory block at the same time as its corresponding data. The write enable and address signals continue to propagate along the write pipeline until they reach the farthest sub-memory block.

The present invention also includes a redundancy circuit adaptable to the memory accessing system as disclosed by the present invention. The redundancy circuit functions to replace defective sub-memory blocks (or defective portions of sub-memory blocks) with replacement sub-memory blocks. The physical location of the redundancy circuit is situated close to the main I/O ports of the memory system. Consequently, the transmission delay time to or from the replacement sub-memories is approximately the same as the closest sub-memory block. Since, the transmission delay for the replacement sub-memories is shorter than the transmission delay of a sub-memory located farther from the main I/O ports the redundancy circuit of the present invention introduces clock cycle delays to the data path of the replacement sub-memories so that they output their data in the appropriate clock cycles. These added delays correspond to the half cycle delays generated from the latches in the address/control, output, and write pipelines for each associated sub-memory block. The farther a sub-memory block to be replaced is from the main I/O ports, the more latch delays are added to the data path of the replacement sub-memory. The redundancy circuit comprises a fifth set of latches, a second set of multiplexers, and a group of replacement sub-memories. The second set of multiplexers are preset by a configuration signal to select the data path having the same delay as the sub-memory block which is being replaced.

In another embodiment, instead of including an address decode within each of the individual memories, a single decode system is implemented. This system allows decoding of address signals before they are directly coupled to bit and column lines within each of the sub-memories.

Finally, an accessing system with an alternative redundancy scheme is disclosed. The alternative scheme includes a single replacement memory. In this system multiplexers are utilized to override erroneous data with data from the replacement memory.

BRIEF DESCRIPTION OF THE DRAWINGS

FIG. 3 is the timing diagram showing address and accessed data signal propagation during a read operation for the accessing system of the present invention.

FIG. 4 is the timing diagram showing write enable (WE) and write data (WD) signal propagation during a write operation for the accessing system of the present invention.

FIG. 5 illustrates another embodiment of the accessing system of the present invention.

FIG. 6 is the logic diagram of the redundancy circuit of the present invention.

FIG. 7 shows the layout of one embodiment of the accessing system and redundancy circuit of the present invention.

FIG. 8 shows another embodiment of the accessing and redundancy system of the present invention.

FIG. 9A is the timing diagram for a read operation for the accessing and redundancy system shown in FIG. 8.

FIG. 9B is the timing diagram for a write operation for the accessing and redundancy system shown in FIG. 8.

DETAILED DESCRIPTION

A large burst mode memory accessing system is described. In the following description, numerous specific details are set forth, such as logic gates, specific times, etc., in order to provide a thorough understanding of the present invention. It will be obvious, however, to one skilled in the art that these specific details need not be employed to practice the present invention. In other instances, well-known peripheral memory circuitry are not described in detail in order not to unnecessarily obscure the present invention.

Figure 1:
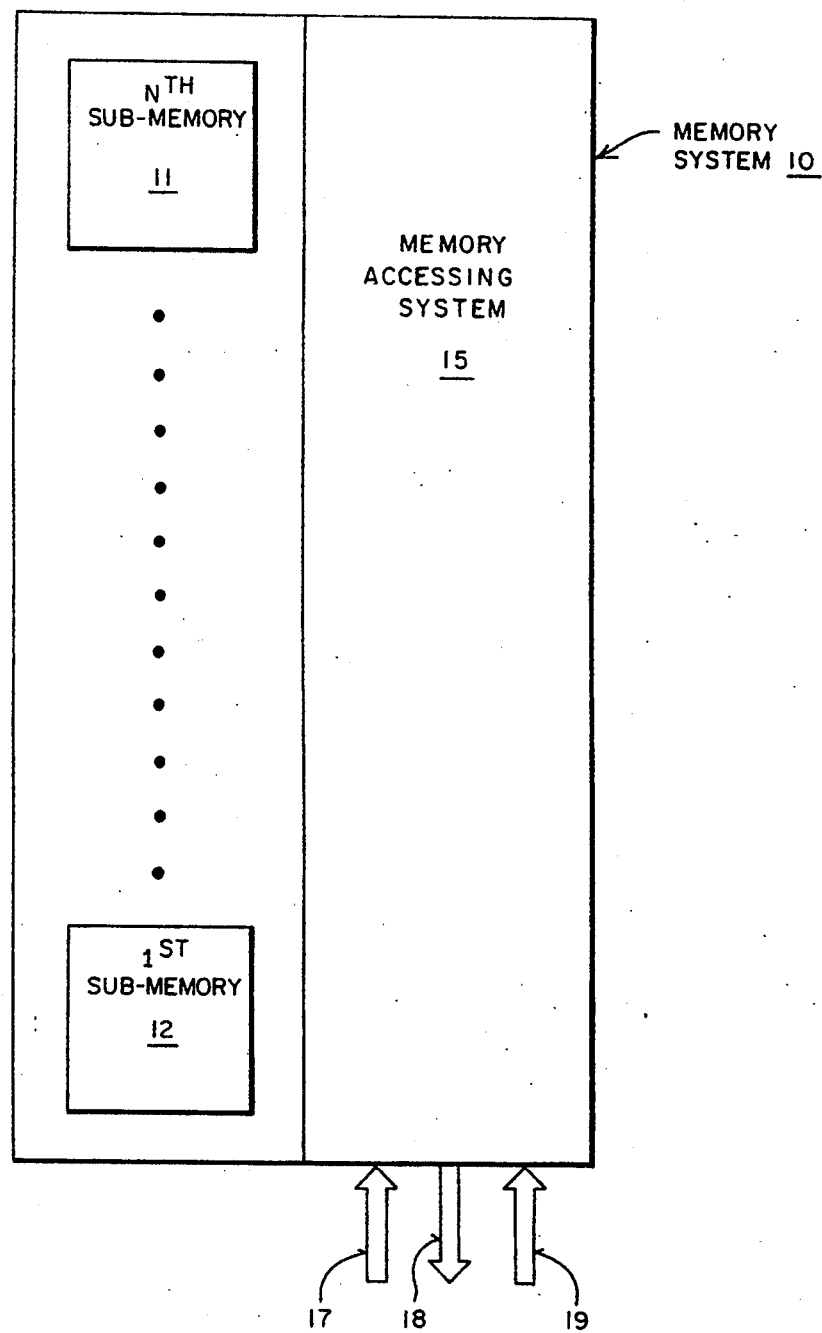
FIG. 1 illustrates the physical layout of a sub-memory type memory system and the accessing system of the present invention.

Referring to FIG. 1 memory system 10 has three main I/O ports. Main input port 17 is employed to couple addresses and control signals to memory system 10. Main output port 18 is for outputting accessed data from the memory system. And, main write input port 19 is for coupling data to be written into the memory system.

Memory system 10 further comprises N sub-memory blocks, (for N being an integer greater than 1). Each sub-memory block is configured the same as a single discrete RAM device. For example, they each have an address/control input, an accessed data output, and a write data input. In addition, each sub-memory block includes an array, decode circuitry, word drivers, etc. The first sub-memory block (sub-memory block 12) represents the memory block physically located closest to main I/O ports 17-19 of memory system 10. As the value of N increases, so does the distance from the main I/O ports. Sub-memory block 11 represents the Nth sub-memory block. The Nth sub-memory block is located farthest from main I/O ports 17-19.

Although, FIG. 1 shows that each sub-memory block is an individual RAM, it is to be understood that the sub-memory blocks are not limited to this embodiment. In one embodiment of the present invention, each sub-memory block is divided into four individual discrete memories. Further, the sub-memory blocks could include more or less individual sub-memory blocks.

The data stored in the sub-memory blocks in the memory system of the present invention is prearranged such that the closest block is accessed first for a specific location within the block, the second closest block is accessed second for the same location and so on until the farthest block is accessed last. For example, as shown in FIG. 3, if an external input/output device (i.e. a CPU), needs to access a large amount of data (referred to as a burst of data) from a memory system having many sub-memory blocks, the word of data stored in the location accessible with address signal A(1) in the closest sub-memory block is the first data word accessed. The next word of data accessed by the CPU is the data stored in the location accessible with address signal A(1) in the second closest sub-memory block. The CPU continues to successively access data until it finally accesses the farthest sub-memory block for location A(1). After all of the A(1) locations are read, the CPU starts to access all of the A(2) locations in the same order as the A(1) locations.

As indicated above, sub-memory 12 is located closest to main I/O ports 17, 18, and 19, and sub-memory block 11 is located farthest from I/O ports 17-19. As a result, there is a shorter transmission delay for sub-memory 12 when compared to sub-memory 11. Generally, prior art accessing systems are designed to account for this difference in transmission delay; typically resulting in worst case transmission delays. The accessing system of the present invention conceals this transmission delay such that the overall accessing time of the memory system is significantly reduced.

The accessing system 15 of the present invention is located along the side of the column of sub-memory blocks in the physical layout of memory system 10 as shown in FIG. 1. Accessing system 15 provides a data and control path so that data can be coupled to or read from the individual sub-memory blocks.

Figure 2:
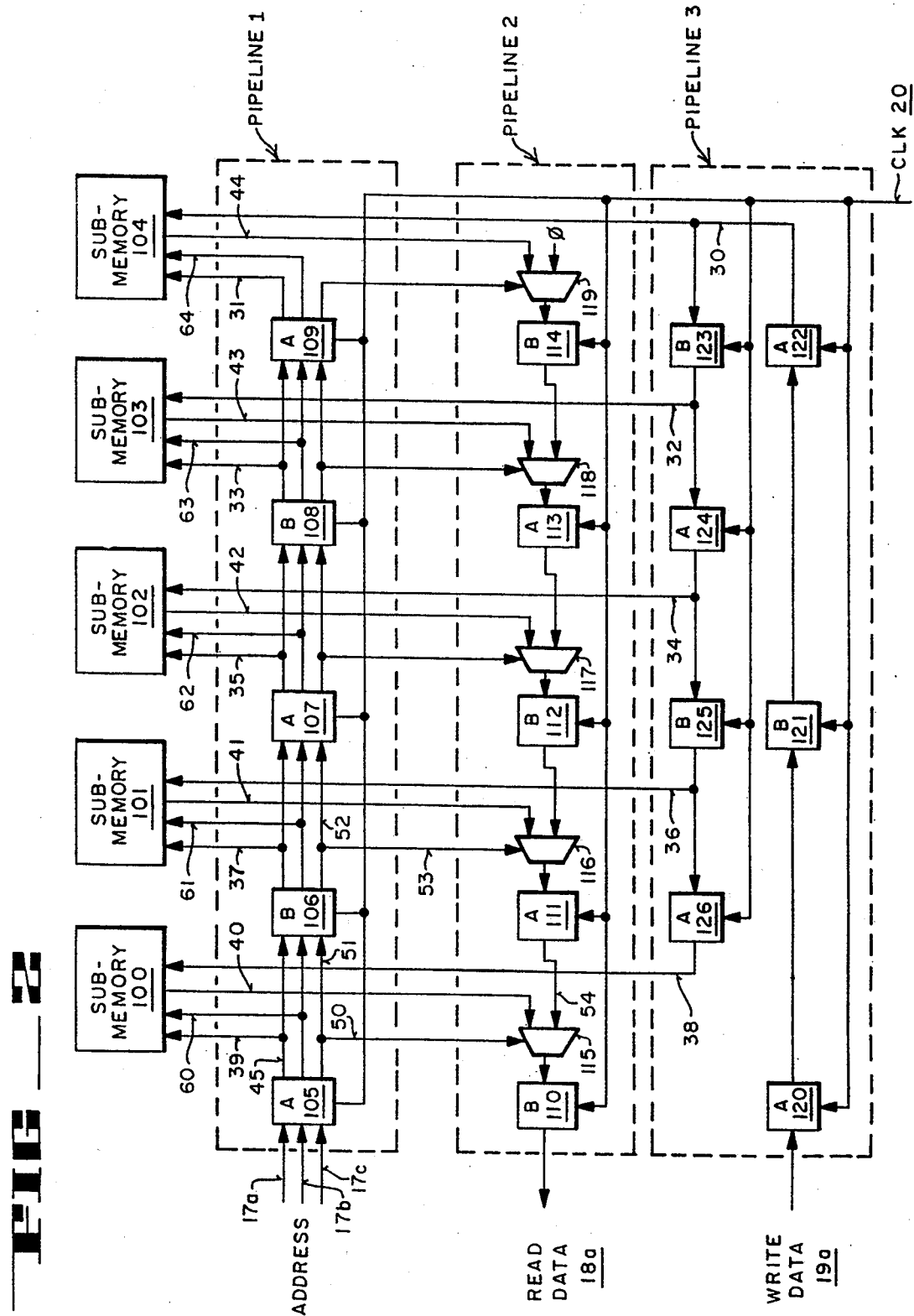
FIG. 2 is the logic diagram of a set of sub-memories and the accessing system of the present invention.

FIG. 2 shows accessing system of the present invention. As can be seen the accessing system has four input ports and one output port (17A-C, 19A, and 18A). These I/O ports are physically located near and are correspondingly coupled to main I/O ports 17, 18, and 19 of the memory system shown in FIG. 1. In the embodiment shown in FIG. 2, the accessing system is coupled to five sub-memories 100-104, i.e. (N=5). Sub-memory 12, in FIG. 1, corresponds to the closest sub-memory 100, shown in FIG. 2. Sub-memory 11 (FIG. 1) corresponds to the farthest sub-memory 104 shown in FIG. 2.

The memory accessing system shown in FIG. 2 is structured such that it contains three information pipelines for getting data to and from the sub-memories; address/control pipeline 1, output pipeline 2, and write data pipeline 3. The three pipelines are physically located next to each other, along side of the column of sub-memory blocks in the memory system circuit layout shown in FIG. 1.

Address/Control Input Pipeline 1

Referring to FIG. 2, address/control pipeline 1 functions to get the address signal to sub-memories 100-104 from input port 17A. Pipeline 1 also functions to get the control signals from input port 17B to the input and output accessing means of each of the N sub-memories and to get the data path control (DPC) signal from input port 17C to multiplexers 115-119. Address/control pipeline 1 comprises latch stages 105A, 106B, 107A, 108B, and 109A. There are the same number of latch stages as them are sub-memory blocks in pipeline 1. For example, for a memory system comprising ten sub-memory blocks there are ten latch stages in pipeline 1.

Each latch stage is coupled to system clock signal 20. Latches with an "A" suffix, (105A, 107A, and 109A), are enabled in the "A" half of the system clock cycle, (see FIG. 3). When a latch stage is enabled all data transitions on its input are passed to its output. In the "B" half of the system clock cycle, A-type latch stages are disabled; i.e. no matter what its input does the output of the latch stage does not change. In contrast, latch stages with a "B" suffix are disabled in the "A" half of the system clock cycle and enabled in the "B" half of the clock cycle.

The address signal outputted by each latch stage in pipeline 1 is coupled to the address input of its corresponding sub-memory block. The control signal outputted by each latch stage in pipeline 1 is coupled to the input/output accessing means of its corresponding sub-memory block. Finally, the DPC signal outputted by each latch stage in pipeline 1 is coupled to the control input of its corresponding multiplexer in pipeline 2. For example, the address signal line for latch stage 105A is coupled to sub-memory 100 on line 39. The control signal line for latch stage 105A is coupled to sub-memory 100 on line 60. And lastly, the DPC signal line for latch stage 105A is coupled to the control input of multiplexer 115 on line 50.

Address, control and DPC signals outputted by each latch stage in pipeline 1 are also coupled to the input of the next adjacent latch stage in pipeline 1. As can be seen in FIG. 2, the address, control, and DPC signal lines from latch stage 105A are coupled to the input of latch stage 106B on lines 45, 47 and 51, respectively. The last latch stage, however, is coupled in a different manner when compared to the other latches. As can be seen in FIG. 2, the DPC signal of latch stage 109A is only coupled to multiplexer 119 and the address and control signals are only coupled to sub-memory 104.

Latches 105A-109A function to gate the address and control signals from input ports 17A and 17B, respectively to each of the sub-memories and to gate the DPC signal from input port 17C to each of the multiplexers. The address signal that is applied to input port 17A and the control signal that is applied to input port 17B are gated in a manner such that each of the sub-memory blocks receives it a half clock cycle after the previous adjacent sub-memory. For example, sub-block 101 receives an address and a control signal sent down pipeline 1 a half clock cycle after the same signal has reached sub-block 100. Further, sub-block 102 receives the same address and control signals one clock cycle after sub-block 100 receives it due to the two half cycle delays generated by latches 106B and 107A. Thus, by the time the address and control signals propagate down pipeline 1, sub-block 104 receives the two signals two clock cycles after sub-block 100. Similarly, the DPC signal that is applied to input port 17C is gated in a manner such that each of the multiplexers receives it a half clock cycle after the previous adjacent multiplexer.

It should be understood that the invented pipeline system shown in FIG. 2 is represented in a simplified form for ease of understanding. For instance, input port 17A is shown as a single input line as are all other lines shown in FIG. 2. In this form input port 17A can accommodate address signals having a single bit width. However, the address signal of the present invention is typically many bits wide. So, to accommodate signals having bit widths greater than 1, input port 17A needs to be a bus comprising many parallel lines. The bus width for each of inputs 17A, 17B, and 17C is determined by the width of the input signals.

Further, as illustrated in FIG. 2, input buses 17A, 17B, and 17C are coupled to latches 105A–109A at each of the half cycle stages. However, latches in general can only handle signals having a single bit width. Thus, another simplification of the embodiment of the present invention shown in FIG. 2 is that each of latches 105A–109A actually represent a set of parallel latches. The number of parallel latches at each half cycle stage is determined by the number of bits in the address signal (input 17A), the control signal (input 17B) and the DPC signal (input 17C).

For example, if the address signal applied to input 17A is 9 bits wide, the DPC signal is 1 bit wide, and the control signal applied on input port 17B is 5 bits wide, input port 17A would be a 9 bit bus, port 17B would be a 5 bit bus and port 17C would be a 1 bit bus. Each of the parallel input lines in buses 17A, 17B and 17C are coupled to a separate latch; instead of utilizing single latch 105A. Thus, latch stage 105A would be substituted by a set of 15 parallel A-type latches. In addition, all other lines, carrying the address and control signals would be buses having the width of their associated signal and the number of latches that these signals pass though would be increased accordingly. For instance, in the 9 bit address, 1 bit DPC signal, and 5 bit control signal case as described above, latch stage 106B would be replaced with 15 B-type parallel latches.

FIG. 3 shows the timing diagram for the accessing system of the present invention. Address signal A(1) is coupled to main input port 17A during clock cycle $1_A$. During clock cycle $1_A$ latch stage 105A is enabled since it is an "A" type latch stage. As a result, address signal A(1) is outputted to the input of latch stage 106B (line 45), and the input address port of sub-memory 100 (line 39). Consequently, sub-memory 100 begins accessing the data at address location A(1). In the embodiment being described, the internal access time of sub-memories 100–104 is five clock cycles. As can be seen in FIG. 3, five clock cycles after A(1) is coupled to line 39, data D(100) is outputted to line 40 during clock cycle $6_A$. Also shown in FIG. 3 is that even though A(1) is coupled to the input of latch stage 106B, it is not gated through to line 46 until the next "B" cycle.

During clock cycle $1_B$, latch stage 106B is enabled. This causes address signal A(1) to be coupled to the input of latch stage 107A (line 46) and the address port of sub-memory 101, (line 37). Consequently, sub-memory 101 begins internally accessing its data located at address location A(1). Since, the internal access time of sub-memory block 101 is five clock cycles, data D(101) is outputted to line 41 during clock cycle $6_B$.

In the next clock cycle 2A, address A(1) is propagated farther down pipeline 1 to sub-memory 102. Similar to the previous sub-memories, sub-block 102 outputs its data five clock cycles later onto line 42. During clock cycle $2_B$, address A(1) is further propagated to sub-block 103, and during clock cycle $3_A$ address A(1) reaches the final memory sub-block 104.

The timing of A(1) with respect to the time that sub-memories 100–104 output their data can be seen in FIG. 3. For example, sub-memory 100 outputs its data during clock cycle $6_A$ and sub-memory 101 outputs its data in clock cycle $6_B$; one half clock cycle later. The reason for this is because sub-memory 100 is accessed a half clock cycle before sub-memory 101. Hence, in the accessing system shown in FIG. 2, a previous sub-memory outputs its data a half clock cycle before the next sub-memory.

It should be noted, that control signals applied to input port 17B propagate along pipeline 1 in the same manner as the address signals on line 17A. These signals function to provide additional control information to sub-memories during the read and write operations.

Data Output Pipeline 2

Output pipeline 2 functions to transfer the accessed data from each sub-memory to output port 18A of the accessing system shown in FIG. 2. Data signals propagate along pipeline 2 from farthest sub-memory block 104 towards output port 18A. Pipeline 2 comprises latches 110B, 111A, 112B, 113A, and 114B and multiplexers 115, 116, 117, 118, and 119. As can be seen, there are the same number of latches and multiplexers in pipeline 2 as there are sub-memory blocks. Thus, for the embodiment shown in FIG. 2, there are each five latches and five multiplexers in pipeline 2.

As was the case for pipeline 1, signal lines in pipeline 2 are shown as one individual line. It is to be understood that the signal lines carrying the accessed data from the sub-memories are buses having widths determined by the number of bits in the accessed data word. Also, the number of latches utilized for each latching stage, i.e. 110B–114B, is also dependent on the width of a single accessed word.

Similar to the latches in pipeline 1, latches 110B–114B are all coupled to and controlled by clock signal 20; (the "A" and "B" latch suffixes indicate the same type of latch performance as previously described for latches 105A–109A). Each latch stage and multiplexer correspond to a specific sub-memory block. For example, latch stage 110B and multiplexer 115 correspond to sub-block 100; latch stage 111A and multiplexer 116 correspond to sub-block 101; latch stage 112B and multiplexer 117 correspond to sub-block 102; latch stage 113A and multiplexer 118 correspond to sub-block 103; and latch stage 114B and multiplexer 119 correspond to memory sub-block 104. Latch stages 110B, 111A, 112B, 113A, and 114B function in the same manner as the latches in pipeline 1, i.e. gating signals along pipeline 2.

The multiplexers in pipeline 2 are utilized to direct the flow of data along pipeline 2. Coupled to each of the inputs of multiplexers 115–119 are three signals; the data signal from a previous latch stage, the data signal from its corresponding sub-memory block, and DPC signal coupled from pipeline 1. For example, the output of latch stage 111A (line 54) is coupled to the first input of multiplexer 115, the second input of multiplexer 115 is coupled to sub-memory 100 (on line 40) and the third input of multiplexer 115 is coupled to the DPC signal on line 50 from pipeline 1.

The farthest multiplexer 119 differs such that one of its inputs is coupled to a voltage corresponding to a low logic level instead of a data signal from another latch stage. The reason for this is to ensure that a known data pattern will be delivered at the output port when no read cycle is in progress. It is to be understood that this multiplexer input could be coupled to a high logic level, (or any arbitrarily selected value), instead.

The DPC signal sets the multiplexers in either a first or second state. In the first state the multiplexers allow data from the previous latch stage to pass through to the next latch stage. For example, in this state, multiplexer 115 allows data on the output of latch 111A (line 54) to pass through to the input of latch 110B. However, when the multiplexers are in the second state, data coupled to the input of the multiplexer originating from the multiplexer's corresponding sub-memory is passed through to the next latch. For example, in the second state, data from the output of sub-memory 100, line 40, is allowed to pass through multiplexer 115 to the input of latch 110B.

Pipeline 1 provides synchronization for the DPC signal by means of latches 105A–109A. As seen in FIG. 3, D(100) is outputted by sub-block 100 onto line 40 during clock cycle $6_A$. The DPC signal is applied to input port 17C during clock cycles $5_B$–$6_A$ (not shown in FIG. 3). The DPC signal has a duration of one clock cycle. After clock cycle $6_A$ (and before $6_B$), DPC passes through latch 105A and sets multiplexer 115 in its second state. At the same time, D(100) is being outputted to line 40. Consequently, multiplexer 115 passes D(100) through to the input of latch 110B.

The DPC signal on line 50 sets multiplexer 115 in the second state for one clock cycle (during clock cycles $6_A$–$6_B$); after this, multiplexer 115 goes back to its first state. DPC continues to propagate along pipeline 1. After clock cycle $6_B$ (and before 7A), DPC is outputted by latch 106B to lines 52 and 53 and sets multiplexer 116 in its second state. At the same time, sub-memory 101 is outputting data D(101) on line 41. Consequently, multiplexer 116 passes D(101) through to the input of latch 111A. D(101) is further propagated along pipeline 2 every half cycle through the latches until it reaches output port 18A one clock cycle after D(100).

The specific timing of the DPC signal as described above is such that the DPC signal has a duration of one clock cycle and it is gated in half cycles along pipeline 1. However, it is to be understood that the important concept behind the timing of the DPC signal is that it is synchronized to arrive at a multiplexer when its corresponding sub-memory is outputting data. This is achieved, because each successive sub-memory block outputs its data separated by half cycles and DPC is being gated along pipeline 1 by half cycle latches 105A–109A.

The access time for the total memory system is approximately equivalent to that of a single sub-memory block. Referring to FIG. 3, the amount of time that elapses from when address A(1) is coupled to input 17A, until data D(100) is available at output port 18A, is six clock cycles. In the embodiment shown in FIG. 2, the internal access time of sub-memory blocks 100–104 is five clock cycles. Thus, the access time for memory system 10 is only one clock cycle more than the access time for one individual sub-memory block.

FIG. 3 also shows data, D(101), being outputted to port 18A in the next clock cycle after D(100) is outputted. This would not be possible in prior art memory accessing systems in which the data path to the memory blocks is tied up until each access operation is complete. Instead, in the accessing system of the present invention, farther sub-memory blocks are accessing data as closer ones are outputting data and passing it along output pipeline 2. As a result, farther sub-blocks have more time to pass data down pipeline 2. Consequently, new data is available at the output of the memory system every clock cycle.

It should also be noted that after the burst of data from all of the sub-memory blocks for address location A(1), the next burst of data for address location A(2) begins in the next subsequent clock cycle. Referring to FIG. 3, output 18A is shown having a first burst of data words D(100)–D(104), for address location A(1) during clock cycles $6_B$–$11_B$, inclusive. Following D(104) is D(100) which is the beginning of the next burst of data for address location A(2). The reason that the next burst follows immediately after the first burst is because that address A(2) is applied to line 45 during clock cycle $6_A$; right after the fifth cycle of address A(1). As a result, by the time the last sub-memory has outputted its data for address location A(1), the first sub-memory is ready to output its data for the next address location A(2).

In other words, a continuous string of data bursts is available at the output of the memory system if the memory system and accessing system are designed such that the number of clock cycles it takes to access data from the individual sub-memories is less than or equal to the number of sub-memories in the memory system; (i.e. number of clock cycles to access individual memory $\leq$ number of sub-memories). If designed in such a manner, the first word of data (from the closest sub-memory) for a burst operation is outputted immediately after the last word of data (from the farthest sub-memory) for a prior burst.

However, if the number of clock cycles to access one of the sub-memory blocks exceeds the number of sub-memory blocks, the bursts do not follow immediately after one another. Instead, the closest sub-memory block is still accessing the first word of data for the next burst by the time the previous burst is outputted by port 18A. Thus, in this case, the data at the output of the accessing system will be in discrete burst envelopes, each envelope having N words (one from each sub-memory). The words in each burst will sequentially follow one another. However, these envelopes will be spaced apart in time and do not continuously flow from the output of the accessing system.

Write Pipeline 3

The write pipeline 3 of the present invention functions to transfer write data to the sub-memory blocks. Pipeline 3 is coupled to each of the sub-memory block's write input. Line 30 is the write input for sub-memory block 104. Similarly, lines 32, 34, 36, and 38 are the write input lines for sub-memory blocks 103, 102, 101, and 100, respectively. Pipeline 3 employs three latches, 120A, 121B, and 122A, to propagate data from input port 19A to line 30 of FIG. 2, (i.e. the write input line for the farthest sub-memory block). Although three latches are shown in the embodiment illustrated in FIG. 2, the actual number of latches is determined by the distance the data must propagate, i.e from input port 19A to line 30, and the frequency of the data signals. As a result, the particular size and configuration of the memory system also determines the number of latches.

As described for pipelines 1 and 2, the buses employed in pipeline 3 are all shown as being single lines. However, it should be obvious that the single lines may be substituted with buses having bit widths greater than one to accommodate associated data signals. In addition, latch stages may be modified in a manner as described above.

Three signals must be present at the inputs of a sub-memory block for a write function to occur, the write data (WD) signal, the write enable (WE) signal, and the address signal. The WD signal is coupled to the write input of each sub-memory block via pipeline 3. The WD signal is a string of words, one word of data for each sub-memory block. Each of the words have any number of bits. The words of data are coupled to the input port 19A of pipeline 3, every clock cycle.

Referring to FIG. 4, WD(100) is shown a half clock cycle after it has been applied to input 19A and has passed through latch 120A to node 21 (during clock cycle 1); WD(101) is shown a clock cycle later at node 21, in clock cycle 2 and so on. The last word of the WD signal, WD(104), is shown to be at node 21 in clock cycle 5. After passing through latch 120A, the WD signal is gated by half cycle latches 121B, 122A along pipeline 3 to line 30, FIG. 2.

The second signal necessary for performing a write operation is the WE signal. The WE signal is coupled to input 17B of pipeline 1 a predetermined time after WD(100) is coupled to input 19A. The WE signal propagates along pipeline 1 through latches 105A–109A and is coupled to each of the sub-memory blocks in half clock cycle intervals on lines 60–64 to the I/O accessing means for each sub-memory.

Finally the appropriate address signal must be coupled to each of the sub-memory blocks when a write operation occurs. The address signal is applied to input 17A.

Since WD(100) is the first word of the WD signal sent down pipeline 3, it arrives first at line 30, (refer to FIG. 2). However, at the time that WD(100) arrives at the write data input (line 30) of sub-memory block 104, the WE signal is not yet present on control input line 64 of sub-memory block 104. Therefore, WD(100) is not written into sub-block 104. Instead, WD(100) is gated farther down pipeline 3, through latches 123B–126A, to sub-memory block 100. As WD(100) propagates along pipeline 3, it is not written into any of the memories since the WE signal is not present on their corresponding control inputs.

The WE signal is applied to input 17B of pipeline 1 while WD(100) is propagating towards sub-memory block 100. The WE signal propagates in the opposite direction as the WD(100) signal; (i.e. the WD signal is propagating from the farthest to the closest sub-blocks along pipeline 3 and the WE signal is propagating from the closest to the farthest sub-blocks along pipeline 1). WE is synchronously coupled to input port 17B such that it arrives at sub-block 100's control input (line 60) during the same clock cycle that WD(100) arrives at sub-block 100's write data input (line 38). In this way, WD(100) is written into sub-memory block 100.

As can be seen in FIG. 4, WD(100) is at node 21 during clock cycle 1A. Following clock cycle 1 A, WD(100) must propagate through 6 more latches (latches 121B–126A), each providing a half clock cycle of delay to reach input line 38 of sub-memory 100. Therefore, WD(100) arrives at write input line 38, three clock cycles after clock cycle $1_A$. FIG. 4 shows WD(100) arriving on line 38 in clock cycle $4_A$. Further, WE is applied to input 17B during clock cycle $3_B$. As a result, in the next half clock cycle it arrives on input line 60. As can be seen in FIG. 4, the WE signal is present on line 60 during clock cycle $4_A$ and $4_B$; the same time that WD(100) is present one line 38. Consequently, WD(100) is written into sub-memory 100.

In the next half cycle, WE propagates to line 61 (the Input and output access input for sub-memory 101) through latch 106B. It arrives at line 61 during clock cycle $4_B$. Further, after WD(101) propagates through latch 120A, it must pass through five more latches (latches 121B–123B; a total of two and a half clock cycles of delay) to get to input 36. Consequently, WD(101) arrives at input line 36 during clock cycle $4_B$. Since both the WD and WE signals are present on the inputs of sub-memory 101 at the same time, WD(101) is written into sub-memory block 101.

In contrast to prior art systems in which the write data path is tied up until a full write operation is completed, the present invention's accessing system allows words of data to be coupled to input port 19A every clock cycle. As data is written into one sub-memory block other data is travelling to its designated sub-memory. In this way, data is written into each memory on successive half cycles.

As can be seen, by physically arranging the accessing pipeline in a particular manner relative to the sub-memory blocks, the WE and data signals are made to travel in opposite directions so as to synchronize these signals to arrive at the appropriate sub-memory at the same time.

FIG. 5 shows another embodiment of the accessing system of the present invention. In this embodiment, instead of including an address decode within each of the individual memories, a single decode system may be implemented. This system allows decoding of address signals before they are directly coupled to bit and column lines within each of the sub-memories.

Referring to FIG. 5, the address/control pipeline 1' includes sub-memories 200 and 201 which each comprise an array portion and a peripheral circuitry portion. The peripheral circuitry of each sub-memory comprises the same elements as a single discrete RAM device. For example, they each include input and output word drivers, I/O ports, and typical select and control circuitry. In addition, sub-memories 200 and 201 comprise a memory array for storing data. Sub-memories 200 and 201, however, do not include address decode circuitry as is included in the sub-memories described in previous embodiments. Instead, address decoding is performed by address decode circuit 204.

In FIG. 5, address decode 204 is situated at the beginning of pipeline 1'. Address decode 204 is shown having output lines 1-M, where M is an integer equal to the number of wordlines within each array. Address signals are coupled to address decode 204 on bus 217A. Once decoded by address decode 204, the address signal selects one of the M output lines by setting all but one output line either high or low. Each of the M output lines corresponds to one of the M wordlines in each array. Thus, the decoded address signal selects one of the M wordlines in each array.

The embodiment of the accessing system shown in FIG. 5 also includes latch stages 202A, 203B, 205A, and 206B. As with previously described latch stages, these stages may be comprised of many parallel latches depending on the width of the signals being coupled to them. In addition, the "A" and "B" suffix indicate the same mode of operation as disclosed above. Clk 20 provides the enable/disable signal for each of the latches.

Latch stages 202A and 203B function to synchronize the propagation of the decoded address from decode 204 to the wordlines in each of the sub-memories. As can be seen in FIG. 5, latch stage 202A is coupled between the output of address decode 204 and the input of sub-memory 200. Latch stage 203B is coupled between the sub-memory 200 and sub-memory 201.

Referring to FIG. 5, the decoded address reaches sub-memory 200 after it propagates through half cycle latch stage 202A. When this occurs, sub-memory 200 begins accessing its data on the selected wordline. One half cycle later, the decoded address signal is latched through latch stage 203B. When this occurs, sub-memory 201 begins accessing its data stored at the selected wordline address. Therefore, as with the accessing system shown in FIG. 2, each of the sub-memory blocks begins accessing its data in successive half cycle intervals. As a result data is available at each of the sub-memory block's output port in successive half cycle intervals.

The control and DPC signals are coupled on lines 217B and 217C respectively, and propagate along pipeline 1' through latches 205A and 206B such that they arrive at sub-memories in successive half cycle intervals also. The decoded address signal, control and DPC signals are synchronized along with pipeline 2' so as to cause the accessing system shown in FIG. 5 to function in the same manner as the embodiment of the accessing system shown in FIG. 2.

The embodiment shown in FIG. 5 is simplified to illustrate the single address decode scheme and as such a third write pipeline is not shown. However, it is to be understood that a third write pipeline may be included.

The main advantage of the accessing system shown in FIG. 5 is that it is a more space conservative design layout. This is achieved by eliminating the decode circuitry from each of the sub-memories and coupling wordlines directly from sub-memories to latch stages. Another advantage of the embodiment shown in FIG. 5 is that since the address is already decoded when it is coupled to each of the sub-memories, the delay associated with decoding the address for each of the sub-memories is eliminated. As a result, the access time for an individual sub-memory is reduced. Thus, decreasing the overall access time for the accessing system.

Although the embodiment shown in FIG. 5 includes only two sub-memories, it is to be understood that in may comprise any number of sub-memories. It is also to be understood that an increased number of sub-memories also requires additional corresponding latch stages in the design.

The Redundancy Block Pipe

In the accessing system of the present invention, each sub-memory block has a different transmission delay time. For example, for an address to propagate to sub-memory 100 from main input port 17A, it must first pass through latch 105A. Further, for data to be outputted from sub-memory 100 to main output port 18A, data must pass through latch 110B. Therefore, the transmission delay associated with sub-memory 100 is determined by the delays added by latches 105A and 110B; a time equivalent to one clock cycle. Sub-memory 101, on the other hand, has a longer transmission delay which includes delays contributed from latches 105A and 106B to get to sub-block 101, and delays added from latches 111A and 110B to travel from sub-memory 101 to main output port 18A. The pipeline of the present invention utilizes these transmission delay differences such that adjacent sub-memory blocks are internally accessing their respective data at half clock cycle intervals from each other. The result of this synchronization is that data from sub-memory blocks is outputted every clock cycle from main output port 18 of memory system 10 of FIG. 1.

Consequently, when replacing a defective sub-memory block in this unique accessing system, it is necessary to preserve the transmission delay times generated by the latches of the defective memory. In this way, the data from the replacement memory is outputted into the stream of output data on line 18A, (FIG. 3) during the correct clock cycle. In other words, the redundancy circuit of the present invention provides replacement memories while ensuring synchronization of the output data with respect to the accessing system shown in FIG. 2.

The redundancy circuit of the present invention is located close to main I/O ports 17, 18, and 19 shown in FIG. 1. Thus, the transmission delay for the redundancy circuit, (and replacement memories) to and from main I/O ports 17–19 is approximately the same as the transmission delay of the closest sub-memory block 12 shown in FIG. 1. Or as a further example, the transmission delay of the redundancy circuit to main I/O ports 17–19 is approximately equal to the transmission delay of the closest sub-memory block 100 to the main I/O ports. Memory system address/control input ports 17A and 17B and write data port 19 (shown in FIG. 2) are coupled directly to input port 17D and write data port 19B, respectively, of the redundancy circuit shown in FIG. 6.

Referring to FIG. 6, the redundancy circuit is comprised of two replacement memories, 201 and 202. Although only two memories are shown, more may be employed in other embodiments. One input of each of memories 201 and 202 is coupled to a multiplexer and a latch. As illustrated in FIG. 6, line 20 couples memory 201 to latch 211A and line 21 couples multiplexer 209 to latch 211A. Also shown in FIG. 6, is line 22 coupling memory 202 to latch 212A and line 23 coupling multiplexer 210 to latch 212A.

Transmission delays for replacement memories 201 and 202 are determined by latch pair stages, 205A/B, 206A/B, 207A/B, 208A/B. As with all other buses and latch stages in the accessing system, bus widths and latch stage size is determined by the width of the signals that they carry.

Each of latch pairs 205A/B–208A/B provide one clock cycle of delay and is equivalent to one A-type latch stage in series with a B-type latch stage. For example, the data path from input port 17D, through line 230, to multiplexer 209 or 210 contains no latch delays. However, the data path from the input port 17D of the redundancy circuit through line 231 includes one latch pair delay equivalent to an A-type and B-type latch; i.e one clock delay. Consequently, a signal that propagates through line 231 will arrive at multiplexers 209 or 210 one clock cycle later than a signal traveling through line 230. Further, a signal propagating through line 232 will arrive at the input of the multiplexers one clock cycle later than a signal on line 231. The same relationship exists for lines 233 and 234.

Each of signal lines 230-234 are coupled to one of five inputs of multiplexers 209 and 210. Also coupled to each of the multiplexers is a configuration signal. Configuration signals CS9 and CS10 are coupled to multiplexers 209 and 210, respectively, and determine which of the five input signals on lines 230-234 is passed through to latches 211A and 212A.

As stated above, the redundancy circuit functions to preserve the transmission delays for the individual memory being replaced. For example, if it is necessary to replace sub-memory 100 in FIG. 2, the transmission delay of the replacement memory must match that of sub-memory 100. As shown in FIG. 2, (starting at main input port 17A) an address first passes through latch 105A to get to sub-memory 100. Further, the accessed data from sub-memory block 100 passes through latch 110B to get to main output port 18A. Therefore the transmission delay for sub-memory block 100 is equal to the delay supplied from an A-type latch stage in series with a B-type latch stage, or one clock cycle. Therefore, if a replacement memory replaces sub-memory 100, its data path must also include one clock cycle of delay.

Referring to FIG. 6, when CS9 selects signal line 230 for multiplexer 209, a signal coupled to input 17D first passes through multiplexer 209 and then latch 211A. Further, once data is accessed from replacement memory 201 it is outputted to line 24. Then the accessed data passes through multiplexer 220 and latch 221B to multiplexer 222. The other input of multiplexer 222 is main output port 18A (FIG. 2).

Latches 211A and 221B provide the same transmission delay as latches 105A and 110B in FIG. 2 in sub-memory 100's data path. Therefore, for this example, data outputted by replacement memory 201 arrives at the input of multiplexer 222 at the same time as data outputted by sub-memory block 100.

As can be seen each multiplexer can be configured to include a variable transmission delay in its data path from input port 17D to the output port 18B. In this way, memories 201 and 202 can replace any of sub-memory blocks 100-104 by adding the appropriate delay. Referring to FIG. 6, a data path including line 231 has two A-type and B-type latches each. This provides the same delay as the data path to/from sub-memory block 101. The data path through line 232 is compatible with the data path to/from sub-memory block 102, the data path including line 233 is compatible with the delay associated with sub-memory block 103, and the data path through line 234 is compatible with sub-memory block 104.

The accessed data from each of the replacement memories is coupled to the input of multiplexer 220, (on lines 24 or 25). In addition, replacement data present (RDP) signal is coupled to multiplexer 220 from each of memories 201 and 202, (on lines 26 and 27). The RDP signal determines which data signal (on line 24 or on line 25) is passed through multiplexer 220. For instance, if replacement memory 201 is outputting data, the RDP signal on line 26 causes multiplexer 220 to pass the data on line 24 through to latch 221B.

The output of multiplexer 220 is coupled to the input of latch 221B. Latch 221B passes the accessed data from the replacement memories to the input of multiplexer 222. The other input of multiplexer 222 comes from main output port 18A of the accessing system shown in FIG. 2. The output of multiplexer 222 is coupled to main output port 18 of the memory system in FIG. 1.

Multiplexer 222 is controlled by the redundancy circuit (RC) control signal on line 29 in FIG. 6. The RC signal sets multiplexer 222 so that it either passes data from one of the replacement memories, (available on line 18B) or passes the data accessed from sub-memories 100-104 (available on line 18A). The RC signal originates from the RDP signals on lines 26 and 27. The RDP signals on lines 26 and 27 are coupled to OR gate 219. The output of gate 219 passes through latch 218B, and provides the RC control signal on line 29. In other words, the RDP signals on lines 26 and 27 indicate whether data from either of the replacement memories is available.

For example, if either of the RDP signals indicate that data is present, multiplexer 222 is set to pass the replacement data on line 18B instead of data on line 18A. The replacement data (on line 18B) and the data from the corresponding defective sub-memory block (on line 18A) are synchronized to arrive at multiplexer 222 at the same time. However, the defective data supplied by the accessing system on line 18A is not seen at output port 18 of the memory system (the output of multiplexer 222) shown in FIG. 6 since multiplexer 222 passes the replacement data on line 18B instead.

In contrast, if the RDP signals indicate that no data is present from the replacement memories, multiplexer 222 is set to pass the data from port 18A, (the output of the accessing system shown in FIG. 2). Since the control signals for RDP originate from the redundancy circuit, the accessing system (FIG. 2) is unaware of any changes in synchronization, and its string of output data is unaffected.

The redundancy circuit includes a means for synchronously writing data into the replacement memories. The write data path of the redundancy circuit shown in FIG. 6 includes the same number of half cycle delays generated in the write data path from input 19A to the sub-memory 100 (pipeline 3, FIG. 2). As can be seen in FIG. 2, a signal coupled to input 19A must pass through latches 120A-126A to get to write input line 38. This path includes three A/B latch pairs and an additional A-type latch stage. Referring to the write data path in the redundancy circuit shown in FIG. 6, the data path from write input 19B to replacement memories 201 or 202 also includes three A/B latch pairs and an A-type latch. The latch delays are equivalent for pipeline 3 and the write data path of the redundancy circuit so that synchronization of the address and WE signals remain the same for both circuits. In this way, the appropriate word in the string of data applied to the write data input 19B is at the write input of one of the replacement memories when the appropriate address and WE signal is present at the same replacement memory.

The embodiment of the redundancy circuit of the present invention shown in FIG. 6 shows the variable transmission delay scheme, i.e. latches 205A/B-208A/B and MUXs 209 and 210, being included in the input path of the address signals applied to input port 17D. However, an alternative embodiment of the redundancy circuit may be implemented such that the variable transmission delay is placed in the output path of the data accessed from the replacement memories. For example, data output lines 24 and 25 from replacement memories 201 and 202 would include the variable transmission delay scheme. Another alternative would be to split the transmission delay between input and output data paths.

In general, prior art redundancy schemes have the capability of replacing either a single row or column within an array when a defect occurs in the array of the memory system. In contrast, the redundancy circuit of the present invention replaces a complete sub-memory block. The advantage of replacing one whole sub-memory block is because some defects may be located in areas other than the array. For example, if there is a defect in the decode circuitry of an individual sub-memory block, (i.e. a shorted or open line), erroneous data will be outputted by that sub-memory block. Further, replacing a row or column within that block will not fix the problem. However, if the whole block is replaced, (as is done in the present invention), the defect can be eliminated. Therefore, the redundancy circuit of the present invention is capable of correcting more problems resulting from defects within the memory system.

FIG. 7 shows the layout of another embodiment of a sub-memory type memory system and the accessing system of the present invention. In this embodiment, the memory system comprises a group of sub-memories, 400-402. Each sub-memory is made up of four discrete RAMs. As can be seen in FIG. 7, sub-memories 400-402 comprise individual RAMs M(1), M(2), M(3), and M(4). It is to be understood that the embodiment shown can be expanded to include many more sub-memories.

The arrangement of the individual RAMs in the memory system is such that two of the individual memories, M(1) and M(2), are on one side of pipeline accessing system 403 and the other two individual memories, M(3) and M(4), are on the other side of the accessing system. Since, sub-memory 400 is situated closest to the main I/O ports 404, its individual memories M(1), M(2), M(3) and M(4) have the shortest transmission delays when compared to sub-memories 401 and 402. Further, since sub-memory 402 is situated farthest from main I/O ports 404, its individual memories M(1)-M(4) have the longest transmission delays when compared to sub-memories 400 and 401. The reason for arranging the groups of four individual memories in this manner is to ensure that they all have approximately the same transmission delay time with respect to main I/O ports 404. This ensures correct pipeline timing. As can be seen in FIG. 7, pipeline accessing system 403 is situated parallel to the two columns of individual memories and functions essentially the same as the embodiment shown in FIG. 2 except for the inclusion of a memory select signal.

Since the sub-memories shown in FIG. 7 comprises four individual memories instead of a single memory device, an additional memory select signal is required. The memory select signal is utilized so that one of the four memories can be selected within the sub-memory. The memory select signal may be coupled to control input 17B (shown in FIG. 2). For the embodiment shown in FIG. 7, memory select lines are coupled to one of the four individual memories within each of the sub-memories, i.e. one memory select signal line is coupled to M(1), a second is coupled to M(2), the third is coupled to M(3) and the fourth is coupled to M(4) for each sub-memory. During a read operation, only one of the four lines selects its associated individual memory. Therefore, when an address, A(1), and memory select signal, M(1), are coupled to I/O ports 404 in FIG. 7, the data stored at address location A(1) is accessed from sub-memory 400, individual memory M(1) first, then from sub-memory 401 individual memory M(1) in the next half cycle, and finally from sub-memory 402 individual memory M(1) in the following half cycle.

A similar situation arises during the write operation for the embodiment shown in FIG. 7. Specifically, a memory select signal must accompany the address signal during the write operation such that the data is stored in the proper individual memory.

The redundancy circuit 405, in the embodiment shown in FIG. 7, is located near main I/O ports 404 of the memory system. It comprises four replacement memories, RM(1), RM(2), RM(3), and RM(4). In addition, redundancy circuit 405 includes block 406. Block 406 represents all of the internal circuitry of the redundancy circuit, (as described previously) other than the replacement memories.

In contrast to the embodiment of the redundancy circuit as shown in FIG. 6, each of the replacement memories RM(1)-RM(4), (FIG. 7) are utilized to replace any of the individual memories within the sub-memories and not a whole sub-memory. Consequently, M(1)-M(4) are essentially identical to RM(1)-RM(4). As can be seen in FIG. 7, RM(1)-RM(4) are located near main I/O ports 404 such that they have the same transmission delay as the closest individual memories M(1)-M(4) within sub-memory 400.

It should be noted that the main advantage of implementing a memory and accessing system wherein the sub-memories are divided into four individual memories is that defect correction becomes more efficient. For instance, if a single sub-memory block (which is not divided into four individual memories) has a defect in its fourth quadrant, the whole memory needs to be replaced. This is rather inefficient since only a small portion of the sub-memory needs correction. On the other hand, if the sub-memory is divided into four individual memories, it is possible to replace the portion of the sub-memory in which the defect occurs.

Lastly, FIG. 8 illustrates the pipeline accessing system of the present invention with a different type of redundancy circuit. As can be seen, the accessing system includes the same elements as shown for the accessing system illustrated in FIG. 2. Specifically, the accessing system shown in FIG. 8 includes a set of sub-memories 501-503 and three pipelines 1-3. Sub-memories 501-503 are the same as described above for the embodiment of shown in FIG. 2. In addition, pipelines 1-3 include the same latch stages and multiplexers and function in the same manner as explained above. Input bus 515 is utilized to couple address, control, and DPC signals to pipeline 1. The address and control signals are latched along pipeline 1 and coupled to each of the sub-memories on lines 513-520. Similarly, the DPC signal is latched along pipeline 1 and coupled to multiplexers in pipeline 2 (not shown) on lines 521-524. Accessed data from each of the sub-memories is coupled to pipeline 2 on lines 525-528. Finally, input data to be written into the sub-memories is coupled from pipeline 3 on lines 529-532. The CLK signal 533 is coupled to each of the pipelines to clock the latch stages.

As with the embodiment shown in FIG. 2, address, control and DPC signals propagate along pipeline 1 so that they arrive at sub-memories in successive half cycle intervals. As a result, data is available at the output of adjacent sub-memories in successive half cycle intervals and also data is available at the output of pipeline 2 each successive clock cycle.

The redundancy portion of the accessing system shown in FIG. 8 includes a single replacement memory 504. In addition pipeline 2 includes multiplexer 508 and latch pair stage 506 at its output. Further, pipeline 3 includes multiplexer 509 and latch pair stage 507 at its input.

FIGS. 9A and 9B illustrate timing diagrams for the embodiment of the accessing and redundancy system shown in FIG. 8; assuming that the data from sub-memory 502 is defective. As can be seen the signal at the output of pipeline 2, designated as "A" is the normal output signal of the accessing system of the present invention. Specifically, data is outputted from pipeline 2 every successive clock cycle. Referring to signal A in FIG. 9A, a string of data words, WD501-WD504 is outputted from sub-memories 501-504. Signal A is coupled to a single cycle latch pair stage 506. As a result, the signal at the output of latch pair stage 506, designated as "B", is delayed one clock cycle behind signal A. As can be seen in FIG. 9A, signal B lags behind signal A a clock cycle. Signals A and B are both coupled to multiplexer 508, its output being designated as DATAOUT. Also coupled to multiplexer 508 is a first multiplexer control signal, MCNTRL1.

MCNTRL1 determines which data words from signals A and B pass through multiplexer 508 and are outputted to DATA OUT, (FIG. 8). Referring to FIG. 9A, when MCNTRL1 is at a logic low level, indicated by a "0", the data at the output of latch pair stage 506, signal B, is allowed to pass through multiplexer 508, and the data coming directly from pipeline 2, signal A, is blocked. As a result, although data is available from signal A in clock cycle 1 no data is seen at DATA OUT until latch pair stage 506 outputs data; in clock cycle 2. FIG. 9A shows that in clock cycle 2, the data at DATAOUT is the data from sub-memory 501. It should also be noted that the data from the defective sub-memory 502, is blocked from passing to the output.

During clock cycle 3, MCNTRL1 goes to a logic high level, indicated by a "1". When this occurs, data from signal A is allowed to pass and data from signal B is blocked. Therefore, in clock cycle 3, the data from sub-memory 503, (from signal A) passes to DATAOUT and the data from defective sub-memory 502, (from signal B) is blocked. Finally, in clock cycle 4 the data from the replacement memory 504 (from signal A), is passed to DATAOUT by multiplexer 508.

Thus, if a CPU or an I/O device accesses sub-memories, 501-503, the data it receives will actually be the data from sub-memories 501,503, and replacement memory 504. This can be seen in FIG. 9A, signal DATAOUT.

The write operation is performed so as to ensure that the input data is written into the correct sub-memory, i.e. the replacement memory, instead of the defective sub-memory. As described for the write operation in the embodiment of the accessing system of the present invention in FIG. 2, a string of data words or bits are coupled to the WDATA input line shown in FIG. 8. Data words WD501, WD502, and WD503 are coupled to the WDATA input line, (FIG. 9B), and comprise the string of data to be written into sub-memories 501 and 503, and replacement memory 504. Data words WD501-WD503 are also coupled to latch pair stage 507. Signal D at the output of latch pair stage 507 lags behind the signal on WDATA by one clock cycle, (FIG. 9B). The MCNTRL2 signal and multiplexer 509 determine which data words from signals WDATA and signal D will be allowed to pass to the input of pipeline 3, designated by "E" in FIG. 8.

Referring to FIG. 9B, in clock cycle 1, MCNTRL2 is low. As a result, the data on the WDATA input line is passed to the input of pipeline 3. Therefore, the first data word at the input of pipeline 3, (signal E in FIG. 9B) is WD501.

During clock cycle 2, MCNTRL2 indicates a "don't care" signal. In other words MCNTRL2 can either be high or low. This means that either the data on the WDATA line or the data from signal D may be coupled through to pipeline 3. This is true since the data in clock cycle 2 is to be written into defective sub-memory 502. During clock cycle 3, MCNTRL2 goes high, i.e. to a "1" so that data from signal D is passed by multiplexer 509. Thus, the next word of data in the data string coupled to the input of pipeline 3 is WD502. Finally, in clock cycle 4, MCNTRL2 remains high and data word, WD503 (from signal D), is passed to the input of pipeline 3.

Referring to FIG. 9B, input data signal E for pipeline 3 is shown as a string of data words, WD501, WD501/WD502, WD502, and WD503. Since the embodiment of the accessing system shown in FIG. 8 is the same as the embodiment of the accessing system in FIG. 2, the write operation is performed in the same manner. Specifically, the data string at the input of pipeline 3, signal E, is propagated along pipeline 3. Address and Control signals from pipeline 1 are synchronized such that the first data word in the string, WD501, is written into sub-memory 501. Similarly, the second data word, WD501/WD502, is written into sub-memory 502. In a similar manner WD502 is written into sub-memory 503 and WD503 is written into sub-memory 504. Thus, data words, WD501, WD502, and WD503, are written into the three functioning memories, 501,503 and 504, respectively.

As can be seen, when the accessing/redundancy system accesses data from memories 501-504, the data at DATAOUT is the data from memories 501,503 and 504. In addition, when data is written into memories 501-504, the data coupled to input WDATA is actually written into memories 501,503 and 504. Thus, although the memory system comprising sub-memories 501-503 has one defective memory, it still functions as though it has three functional memories.

Finally, although the accessing system of the present invention can be applied to a single die memory system as described above, it can also be utilized with a system having many discrete memory devices on a printed circuit board, which make up a memory system.

In addition, the accessing system of the present invention is described in conjunction with a memory system having a particular configuration, i.e. a queue of N sub-memories. It is to be understood that this particular memory configuration is not meant to be limiting in any way. Specifically, the main idea behind the present invention is the relative disposition of the three parallel pipelines about the N sub-memories so as to allow signals to be synchronized in a specific manner for a burst mode type of memory system. For example, the pipelines are arranged so that during a burst write operation, a first signal travelling in one direction in one pipeline "meets up" with another signal propagating along another pipeline in the opposite direction at just the right moment so that the correct data is written into the appropriate sub-memory.

Further, it should be understood that although the pipelines are shown to be synchronized by latch stages, other synchronization means may be utilized. For example, a set of flip-flops can be configured to render the same results as the latch stages in pipelines 1-3 and in the redundancy circuit.

We claim:

1. A memory system comprising:
   a first input port;
   a second input port;
   an output port;
   a plurality of N memories, where N is an integer, each of said plurality of N memories including an array of storage locations and means for input and output (I/O) accessing of said storage locations, said memories being accessed such that a storage location having an associated address in an ith memory is accessed before said storage location having said associated address in an ith+1 memory, where i is an integer ranging from 1 to N, said plurality of N memories being physically arranged and coupled to said first and second input port and said output port such that the physical distance a given signal must propagate from said first and second input port and said output port to said ith memory is shorter than the physical distance said given signal must propagate from said first and second input port and said output port to said ith+1 memory; and
   a means for accessing said plurality of N memories including;
   a means for generating first and second synchronous control signals;
   a first pipeline for transmitting an addressing signal from said first input port to each of said I/O accessing means of said plurality of N memories, said first pipeline being arranged in relation to said memories such that said addressing signal arrives at said ith memory before arriving at said ith+1 memory, said first pipeline operating in response to said first control signal so as to coupled said addressing signal to said I/O accessing means of said ith memory one half-cycle of said first control signal before said addressing signal is coupled to said I/O accessing means of said ith+1 memory, said ith memory outputting data one half-cycle of said first control signal before said ith+1 memory;
   a second pipeline for transmitting data from said ith and ith+1 memories to said output port in response to said second control signal synchronously supplied from said first pipeline, said second pipeline being arranged in relation to said memories such that data from said ith memory arrives at said output port before data from said ith+1 memory, and wherein data from said ith memory is outputted from said output port one cycle of said first control signal before data from said ith+1 memory;
   a third pipeline for coupling a data signal having N data words from said second input port to the input port of said I/O accessing means of each of said memories, said third pipeline being arranged in relation to said memories such that said data signal arrives at said ith+1 memory before arriving at said ith memory, wherein a write enable signal is synchronously supplied from said first pipeline such that said ith data word is written into said ith memory.

2. In a memory system having a first input port, a second input port and an output port and also comprising a plurality of N memories physically arranged in a queue such that the physical distance a given signal must propagate from said first and second input port and said output port to an ith memory is shorter than the physical distance said given signal must propagate from said first and second input port and said output port to an ith+1 memory, where N is an integer greater than 1 and i is an integer ranging from 1 to N, and said Nth memory is located farthest from said first and second input and output ports, and wherein each of said plurality of N memories comprise an array of storage locations and means for input and output (I/O) accessing of said storage locations, and wherein said plurality of N memories are physically arranged in said queue such that said storage location having an associated address in said array of said ith memory is accessed before said storage location having said associated address in said array of said ith+1 memory, a means for accessing all of said plurality of N memories for said associated address comprising:
   a first pipeline for transmitting said associated address from said first input port to each of said I/O accessing means of said plurality of N memories, said first pipeline being physically located parallel to said queue of said plurality of N memories, said first pipeline being controlled by a first control signal such that said associated address is synchronized as it propagates along said first pipeline, wherein said first pipeline couples said associated address to said I/O accessing means of said ith memory one half cycle of said first control signal before said first pipeline couples said associated address to said I/O accessing means of said ith+1 memory, and wherein said ith memory outputs its accessed data one half cycle of said first control signal before said ith+1 memory outputs its accessed dam;
   a second pipeline for transmitting said accessed data from said ith and ith+1 memories to said output port, said second pipeline being physically located parallel to said queue of said plurality of N memories, said second pipeline functioning to sequentially control said accessed data from said ith and said ith+1 memories in response to a second control signal, said second control signal being synchronously supplied from said first pipeline such that said accessed data from said ith memory is outputted by said output port before said accessed data from said ith+1 memory, said second pipeline also synchronizing the timing of said accessed data from said ith and said ith+1 memories as it propagates along said second pipeline in response to said first control signal wherein said accessed data from said ith memory is outputted from said output port one cycle of said first control signal before said accessed data from said ith+1 memory.

3. The accessing means as described in claim 2 further comprising a third pipeline having a first branch for synchronously propagating a data signal from said second input to a first node, said first node being the input port of the I/O accessing means of said Nth memory, said data signal comprising N data words, said third pipeline also having a second branch for propagating said data signal from said first node to said I/O accessing means of said ith memory, said third pipeline being responsive to said first control signal, wherein a write enable signal and said associated address are synchronized by said first pipeline relative to said data signal on said third pipeline such that said write enable signal, said associated address, and an ith data word are coupled to said I/O accessing means of said ith memory simultaneously, wherein said ith data word is written into said ith memory.

4. The accessing means as described in claim 2 wherein said first pipeline comprises a first set of N latching means wherein the ith latching means of said first set of N latching means is in closer physical proximity to said first and second input and output ports than the ith+1 latching means of said first set of N latching means, said first set of N latching means being coupled in series, an output of said ith latching means being coupled to said I/O accessing means of said ith memory, said first set of N latching means being controlled by said first control signal such that said ith latching means passes data on its input through to its output during a first half cycle of said first control signal and wherein said ith+1 latching means passes data at its input through to its output during a second half cycle of said clock signal.

5. The accessing means as described in claim 2 wherein said second pipeline comprises a second set of N latching means being controlled by said first control signal and a plurality of N multiplexers being controlled by said second control signal, an output of the ith multiplexer being coupled to an input of the ith latching means of said second set of N latching means and an output of the ith+1 latching means of said second set of N latching means being coupled to a first input of said ith multiplexer, said I/O accessing means of said ith memory being coupled to a second input of said ith multiplexer, each of said plurality of N multiplexers having a first state and a second state, said first and second states of said plurality of N multiplexers being synchronously controlled by said second control signal, wherein when said ith multiplexer is in said second state it passes said access data from said ith memory to said input of said ith latching means and when said ith multiplexer is in said first state it passes data from said ith+1 latching means to said input of said ith latching means.

6. The accessing means as described in claim 3 wherein said first and second branch of said third pipeline comprise a third set of latching means being controlled by said first control signal, said third set of latching means being coupled in series along said first and second branches, said third set of latching means for synchronously propagating said data signal along said third pipeline.

7. The accessing system as described in claim 3 further comprising an apparatus for replacing data outputted by said second pipeline from at least one of said plurality of N memories with data from at least one redundant memory, said at least one redundant memory comprising an array of storage locations and means for input and output (I/O) accessing of said storage locations, said data replacement apparatus having a means for variably gating said associated address from the input of said data replacement apparatus to said I/O accessing means of said at least one redundant memory by providing N signal paths to said I/O accessing means of said at least one redundant memory, said variable gating means being responsive to a fourth signal, said fourth signal for selecting one of said N signal paths, each of said N signal paths having an associated delay corresponding to each of said plurality of N memories, said data replacement apparatus also having a means for multiplexing data accessed from said redundant memory with data outputted by said second pipeline from at least one of said plurality of N memories, said output of said data multiplexing means being coupled to said output port of said memory system, said variable gating means in response to said first control signal and said fourth control signal causing said at least one redundant memory to be accessed such that said data from said at least one redundant memory and said data outputted by said second pipeline from at least one of said plurality of N memories are coupled to said data multiplexing means at the same time, said data multiplexing means being responsive to a fifth control signal such that said accessed data from said at least one redundant memory is coupled to said output port of said memory system instead of said data outputted by said second pipeline from said at least one of said plurality of N memories, said fifth control signal being internally generated by said data replacement apparatus.

8. The accessing system as described in claim 7 wherein said replacement apparatus further comprising a means for synchronously writing said ith data word of said N data words into said at least one redundant memory, said synchronous writing means causing said ith data word to be coupled to said I/O accessing means of said at least one redundant memory at the same time that said variable gating means causes said write enable and said associated address to be coupled to said I/O accessing means of said at least one redundant memory, wherein said ith data word is written into said at least one redundant memory.

9. The accessing system as described in claim 7 wherein said variable gating means comprises a first set of latch pair means being coupled in series and being responsive to said first signal, an output of each of said first set of latch pair means being coupled to an input of at least one multiplexer, said output of said each of said first set of latch pair means providing one of said N data paths, said at least one multiplexer in response to said fourth control signal selecting said one of said N data paths.

10. The accessing system as described in claim 7 wherein said synchronous writing means comprises a second set of latch pair means being coupled in series and being responsive to said first signal.

11. The accessing system as described in claim 3 further comprising an apparatus for blocking defective data from said output port and providing valid data, said apparatus including a replacement memory disposed adjacent to said ith+1 memory and coupled to said first and second pipelines, a means for providing delayed accessed data corresponding to said accessed data from said ith and said ith+1 memories, said delayed data means being coupled to said second pipeline, said apparatus further including first means for selecting between said accessed data and said delayed accessed data, said first data select means being coupled to said second pipeline and being controlled by a first select signal such that said first data select means outputs either said accessed data or said delayed accessed data to said output port, wherein defective data from one of said N memories is blocked from being outputted by said output port and accessed data from said replacement memory is passed to said output port.

12. The accessing system as described in claim 11 wherein said apparatus for blocking defective data from said output port and providing valid data further comprises a means for providing a modified data signal to said third pipeline wherein each of said N−1 data words are written into non-defective memories and said Nth data word is written into said replacement memory.

13. The accessing system as described in claim 12 wherein said means for providing said modified data signal comprises a means for providing a delayed data signal corresponding to said data signal, said delayed data signal means being coupled to said second input port, said means for providing said modified data also including second means for selecting between said data signal and said delayed data signal, said second data select means being coupled to said third pipeline and being controlled by a second select signal such that said second data select means outputs either said data signal or said delayed data signal to said third pipeline.

14. The accessing system as described in claim 3 wherein the number of first control signal cycles it takes to internally access one of said plurality of N memories is less than or equal to N.

15. In a memory system having a first input port, a second input port and an output port and also comprising a plurality of N memories physically arranged in a queue, such that the physical distance a given signal must propagate from said first and second input port and said output port to an ith memory is shorter than the physical distance said given signal must propagate from said first and second input port and said output port to an ith+1 memory, where N is an integer greater than 1 and where i is an integer ranging from 1 to N, and said Nth memory is located farthest from said first and second input and said output port, and wherein each of said plurality of N memories comprise an array of storage locations and means for input and output (I/O) accessing of said storage locations, and wherein said plurality of N memories are physically arranged in said queue such that said storage location having an associated address in said array of said ith memory is accessed before said storage location having said associated address in said array of said ith+1 memory, a means for accessing all of said plurality of N memories for said associated address comprising:

a first pipeline for transmitting said associated address from said first input port to each of said I/O accessing means of said plurality of N memories, said first pipeline being physically located parallel to said queue of said plurality of N memories, said first pipeline being controlled by a first control signal such that said associated address is synchronized as it propagates along said first pipeline, wherein said first pipeline couples said associated address to said I/O accessing means of said ith memory one half cycle of said first control signal before said first pipeline couples said associated address to said I/O accessing means of said ith+1 memory, and wherein said ith memory outputs its accessed data one half cycle of said first control signal before said ith+1 memory outputs its accessed data;

a second pipeline for transmitting said accessed data from said ith and ith+1 memories to said output port, said second pipeline being physically located parallel to said queue of said plurality of N memories, said second pipeline functioning to sequentially control said accessed data from said ith and said ith+1 memories in response to a second control signal, said second control signal being synchronously supplied from said first pipeline such that said accessed data from said ith memory is outputted by said output port before said accessed data from said ith+1 memory, said second pipeline also synchronizing the timing of said accessed data from said ith and said ith+1 memories as it propagates along said second pipeline in response to said first control signal wherein said accessed data from said ith memory is outputted from said output port one cycle of said first control signal before said accessed data from said ith+1 memory;

a third pipeline having a first branch for synchronously propagating a data signal from said second input to a first node, said first node being the input port of the I/O accessing means of said Nth memory, said data signal comprising N data words, said third pipeline also having a second branch for propagating said data signal from said first node to said I/O accessing means of said ith memory, said third pipeline being responsive to said first control signal, a write enable signal and said associated address being synchronized by said first pipeline relative to said data signal on said third pipeline such that said write enable signal, said associated address, and said ith data word are coupled to said I/O accessing means of said ith memory simultaneously, wherein said ith data word is written into said ith memory.

16. The accessing means as described in claim 15 wherein said first pipeline comprises a first set of N latching means wherein the ith latching means of said first set of N latching means is in closer physical proximity to said first and second input and output ports than the ith+1 latching means of said first set of N latching means, said first set of N latching means being coupled in series, the output of said ith latching means being coupled to said I/O accessing means of said ith memory, said first set of N latching means being controlled by said first control signal such that said ith latching means of said first set of N latching means passes data on its input through to its output during a first half cycle of said first control signal and wherein said ith+1 latching means of said first set of N latching means passes data at its input through to its output during a second half cycle of said clock signal.

17. The accessing means as described in claim 15 wherein said second pipeline comprises a second set of N latching means being controlled by said first control signal and a plurality of N multiplexers being controlled by said second control signal, the output of said ith multiplexer being coupled to the input of said ith latching means of said second set of N latching means and the output of said ith+1 latching means of said second set of N latching means being coupled to a first input of said ith multiplexer, said I/O accessing means of said ith memory being coupled to the second input of said ith multiplexer, each of said plurality of N multiplexers having a first state and a second state, said first and second states of said plurality of N multiplexers being synchronously controlled by said second control signal, wherein when said ith multiplexer is in said second state it passes said access data from said ith memory to the input of said ith latching means and when said ith multiplexer is in said first state it passes data from said ith+1 latching means to the input of said ith latching means.

18. The accessing means as described in claim 15 wherein said first and second branch of said third pipeline comprise a third set of latching means being controlled by said first control signal, said third set of latching means being coupled in series along said first and second branches, said third set of latching means for synchronously propagating said data signal along said third pipeline.

19. The accessing system as described in claim 15 further comprising an apparatus for replacing data outputted by said second pipeline from at least one of said plurality of N memories with data from at least one redundant memory, said at least one redundant memory comprising an array of storage locations and means for input and output (I/O) accessing of said storage locations, said data replacement apparatus having a means for variably gating said associated address from the input of said data replacement apparatus to said I/O accessing means of said at least one redundant memory by providing N signal paths to said I/O accessing means of said at least one redundant memory, said variable gating means being responsive to a fourth signal, said fourth signal for selecting one of said N signal paths, each of said N signal paths having an associated delay corresponding to each of said plurality of N memories, said data replacement apparatus also having a means for multiplexing data accessed from said redundant memory with said data outputted by said second pipeline from at least one of said N memories, said output of said data multiplexing means being coupled to said output port of said memory system, said variable gating means in response to said first control signal and said fourth control signal causing said at least one redundant memory to be accessed such that said data from said at least one redundant memory and said data outputted by said second pipeline from at least one of said plurality of N memories are coupled to said data multiplexing means at the same time, said data multiplexing means being responsive to a fifth internally generated control signal such that said accessed data from said at least one redundant memory is coupled to said output port of said memory system instead of said data outputted by said second pipeline from at least one of said plurality of N memories.

20. The accessing system as described in claim 19 wherein said replacement apparatus further comprising a means for synchronously writing said ith data word of said N data words into said at least one redundant memory, said synchronous writing means causing said ith data word to be coupled to said I/O accessing means of said at least one redundant memory at the same time that said variable gating means causes said write enable and said associated address to be coupled to said I/O accessing means of said at least one redundant memory, wherein said ith data word is written into said at least one replacement memory.

21. The accessing system as described in claim 20 wherein said variable gating means comprises a first set of latch pair means being coupled in series and being responsive to said first control signal, the output of each of said first set of latch pair means being coupled to the input of at least one multiplexer, said output of said each of said first set of latch pair means providing one of said N data paths, said at least one multiplexer in response to said fourth control signal selecting said one of said N data paths.

22. The accessing system as described in claim 21 wherein said synchronous writing means comprises a second set of latch pair means being coupled in series and being responsive to said first control signal.

23. The accessing system as described in claim 15 wherein the number of first control signals cycles it takes to access one of said plurality of N memories is less than or equal to N.

* * * * *